(12) United States Patent
Baek et al.

(10) Patent No.: US 11,393,755 B2
(45) Date of Patent: Jul. 19, 2022

(54) THREE-DIMENSIONAL SEMICONDUCTOR MEMORY DEVICES

(71) Applicant: SAMSUNG ELECTRONICS CO., LTD., Suwon-si (KR)

(72) Inventors: Seokcheon Baek, Hwaseong-si (KR); Junhyoung Kim, Seoul (KR); Jisung Cheon, Ansan-si (KR)

(73) Assignee: SAMSUNG ELECTRONICS CO,, LTD., Suwon-si (KR)

(*) Notice: Subject to any disclaimer, the term of this patent is extended or adjusted under 35 U.S.C. 154(b) by 187 days.

(21) Appl. No.: 16/526,363

(22) Filed: Jul. 30, 2019

(65) Prior Publication Data

US 2020/0194373 A1    Jun. 18, 2020

(30) Foreign Application Priority Data

Dec. 14, 2018 (KR) .................. 10-2018-0161616

(51) Int. Cl.
*H01L 23/535* (2006.01)
*H01L 21/762* (2006.01)
*H01L 27/11582* (2017.01)
*H01L 27/11556* (2017.01)

(52) U.S. Cl.
CPC ...... *H01L 23/535* (2013.01); *H01L 21/76224* (2013.01); *H01L 27/11556* (2013.01); *H01L 27/11582* (2013.01)

(58) Field of Classification Search
CPC ......... H01L 27/11556; H01L 27/11582; H01L 23/535; H01L 21/76224
See application file for complete search history.

(56) References Cited

U.S. PATENT DOCUMENTS

| 8,901,707 | B2 | 12/2014 | Park et al. |
| 9,165,938 | B1 | 10/2015 | Kim et al. |
| 9,171,860 | B2 | 10/2015 | Chae et al. |
| 9,190,514 | B2 * | 11/2015 | Lee .................. H01L 27/115 |
| 9,601,496 | B2 | 3/2017 | Lee et al. |
| 9,831,180 | B2 | 11/2017 | Shingu et al. |
| 9,978,766 | B1 | 5/2018 | Hosoda et al. |
| 2018/0261626 | A1 | 9/2018 | Yon et al. |

FOREIGN PATENT DOCUMENTS

KR    10-2016-0000047    1/2016

* cited by examiner

*Primary Examiner* — Sue A Purvis
*Assistant Examiner* — Scott Stowe
(74) *Attorney, Agent, or Firm* — F. Chau & Associates, LLC

(57) ABSTRACT

A three-dimensional semiconductor memory device includes a stack structure disposed on a substrate and including lower and upper stack structures, first and second isolation trenches defining the stack structure, extending in a first direction, and spaced apart from each other in a second direction, a middle isolation trench penetrating the upper stack structure between the first and second isolation trenches and extending in the first direction, and a horizontal isolation pattern connected to the middle isolation trench and dividing the upper stack structure in the second direction. The horizontal isolation pattern includes horizontal isolation portions, each of which extends in the first direction and is offset from an extension line of the middle isolation trench in the second direction or an opposite direction to the second direction.

18 Claims, 38 Drawing Sheets

THREE-DIMENSIONAL SEMICONDUCTOR MEMORY DEVICES

CROSS-REFERENCE TO RELATED APPLICATIONS

This application claims priority under 35 U.S.C. § 119 to Korean Patent Application No. 10-2018-0161616, filed on Dec. 14, 2018 in the Korean Intellectual Property Office, the disclosure of which is hereby incorporated by reference in its entirety.

TECHNICAL FIELD

Exemplary embodiments of the inventive concept relate to three-dimensional (3D) semiconductor memory devices and, more particularly, to 3D semiconductor memory devices having improved reliability and integration density.

DISCUSSION OF THE RELATED ART

Semiconductor devices have become highly integrated to provide excellent performance and low manufacture costs. The integration density of semiconductor devices directly affects the costs of the semiconductor devices, thereby resulting in a demand of highly integrated semiconductor devices. The integration density of two-dimensional (2D) or planar semiconductor devices may be primarily determined by an area occupied by a unit memory cell. Therefore, the integration density of the 2D or planar semiconductor devices may be greatly affected by a technique of forming fine patterns. However, since extremely high-priced apparatuses are needed to form fine patterns, although the integration density of 2D semiconductor devices continues to increase, it is still limited. Thus, three-dimensional (3D) semiconductor memory devices have been developed to overcome the above limitations. 3D semiconductor memory devices may include memory cells three-dimensionally arranged.

SUMMARY

Exemplary embodiments of the inventive concept provide three-dimensional (3D) semiconductor memory devices capable of improving reliability and integration density.

In an exemplary embodiment, a 3D semiconductor memory device includes a stack structure disposed on a substrate and including a lower stack structure and an upper stack structure, first and second isolation trenches defining the stack structure and extending in a first direction, the first and second isolation trenches spaced apart from each other in a second direction, a middle isolation trench penetrating the upper stack structure between the first and second isolation trenches and extending in the first direction, and a horizontal isolation pattern connected to the middle isolation trench and dividing the upper stack structure in the second direction. The horizontal isolation pattern includes a plurality of horizontal isolation portions, each of which extends in the first direction and is offset from an extension line of the middle isolation trench in the second direction or an opposite direction to the second direction.

In an exemplary embodiment, a 3D semiconductor memory device includes a stack structure disposed on a substrate and including a lower stack structure and an upper stack structure, first and second isolation trenches defining the stack structure and extending in a first direction, the first and second isolation trenches spaced apart from each other in a second direction, a middle isolation trench penetrating the upper stack structure between the first and second isolation trenches and extending in the first direction, and a horizontal isolation pattern connected to the middle isolation trench and dividing the upper stack structure in the second direction. The upper stack structure includes a pair of first upper electrode layers disposed at the same level, and the first upper electrode layers respectively include pad protrusions protruding toward each other.

In an exemplary embodiment, a 3D semiconductor memory device includes a stack structure disposed on a substrate and including a lower stack structure and an upper stack structure, first and second isolation trenches defining the stack structure and extending in a first direction, the first and second isolation trenches spaced apart from each other in a second direction, a middle isolation trench penetrating the upper stack structure between the first and second isolation trenches and extending in the first direction, and a horizontal isolation pattern connected to the middle isolation trench and dividing the upper stack structure in the second direction. The upper stack structure includes first string selection lines and second string selection lines disposed on the first string selection lines. The horizontal isolation pattern includes horizontal isolation portions, each of which extends in the first direction and is offset from an extension line of the middle isolation trench in the second direction or an opposite direction to the second direction. The first string selection lines are separated from each other in the second direction by the horizontal isolation pattern, and the second string selection lines are also separated from each other in the second direction by the horizontal isolation pattern.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
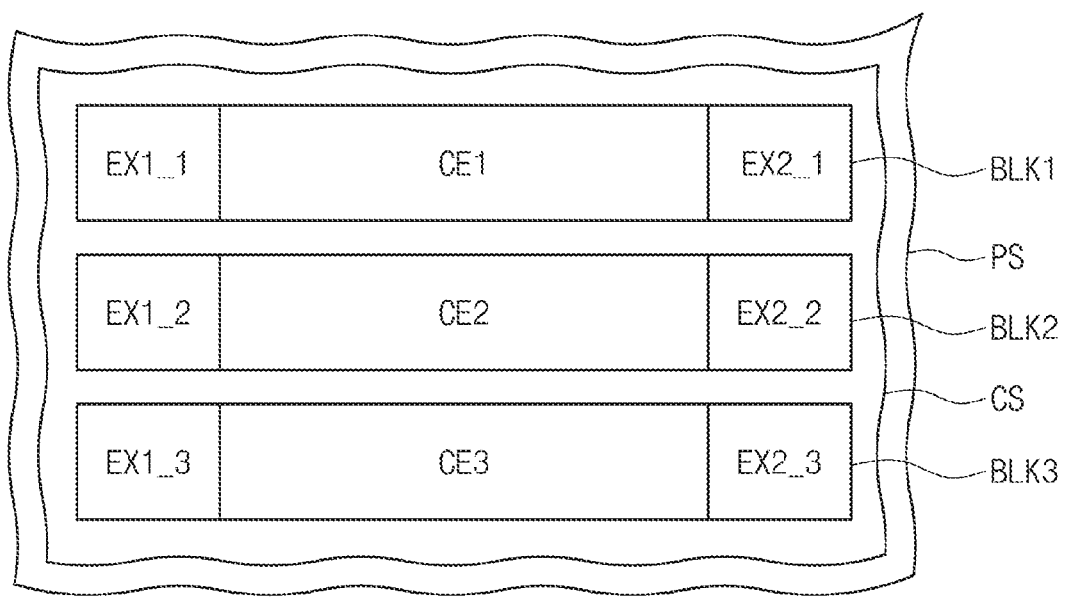
FIG. 1 is a conceptual view schematically illustrating a three-dimensional (3D) semiconductor memory device according to exemplary embodiments of the inventive concept.

Exemplary embodiments of the present inventive concept will be described more fully hereinafter with reference to the accompanying drawings. Like reference numerals may refer to like elements throughout the accompanying drawings.

It will be understood that descriptions of features or aspects within each exemplary embodiment should typically be considered as available for other similar features or aspects in other exemplary embodiments, unless the context clearly indicates otherwise.

FIG. 1 is a conceptual view schematically illustrating a three-dimensional (3D) semiconductor memory device according to exemplary embodiments of the inventive concept.

Referring to FIG. 1, a 3D semiconductor memory device according to exemplary embodiments may include a peripheral logic structure PS and a cell array structure CS disposed on the peripheral logic structure PS. For example, the peripheral logic structure PS and the cell array structure CS may vertically overlap with each other. That is, the 3D semiconductor memory device according to exemplary embodiments of the inventive concept may have a cell-on-peripheral (COP) structure. In exemplary embodiments, the peripheral logic structure PS and the cell array structure CS may be horizontally spaced apart from each other. The peripheral logic structure PS may include, for example, row and column decoders, a page buffer and control circuits, which control a cell array of the 3D semiconductor memory device.

The cell array structure CS may include a plurality of memory blocks BLK1 to BLK3, each of which corresponds to a data erase unit. The memory blocks BLK1 to BLK3 may include cell array regions CE1 to CE3 having 3D structures (or vertical structures), respectively. The cell array regions CE1 to CE3 may include a plurality of memory cells three-dimensionally arranged, and word lines and bit lines electrically connected to the memory cells. First connection regions EX1_1, EX1_2 and EX1_3 (hereinafter referred to as EX1) may be disposed at first sides of the cell array regions CE1 to CE3, respectively, and second connection regions EX2_1, EX2_2 and EX2_3 (hereinafter referred to as EX2) may be disposed at second sides of the cell array regions CE1 to CE3, respectively. For example, the connection region EX1 may be disposed on first sides of the cell array regions CE1 to CE3, and the connection region EX2 may be disposed on second, opposing sides of the cell array regions CE1 to CE3. The connection regions EX1 and EX2 may be regions in which conductive lines extending from the memory cells are connected to contact plugs. A memory cell array having the 3D structure and the connection regions will be described hereinafter in detail with reference to the drawings.

Figure 2:
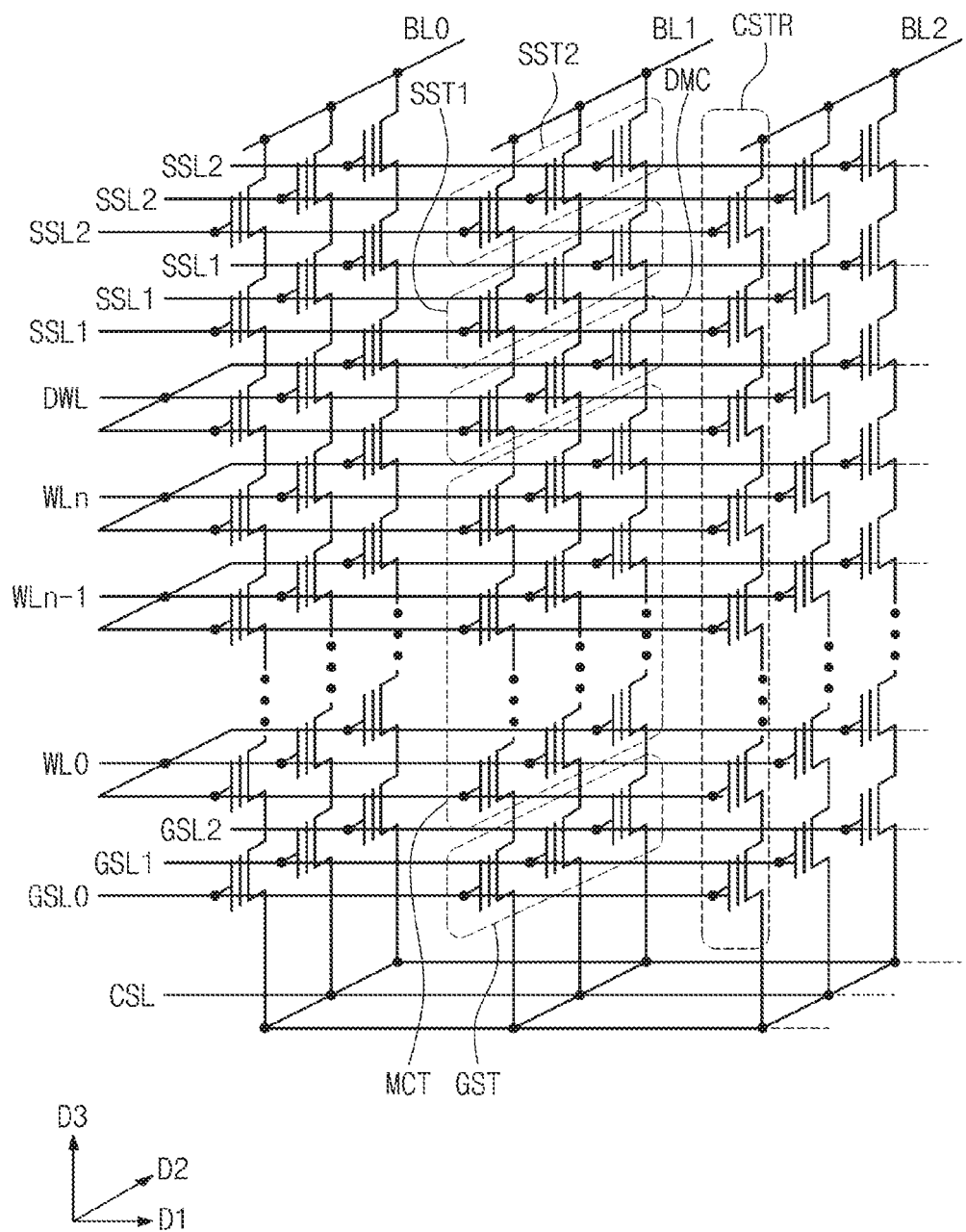
FIG. 2 is a schematic circuit diagram illustrating a cell array region of a 3D semiconductor memory device according to exemplary embodiments of the inventive concept.

FIG. 2 is a schematic circuit diagram illustrating a cell array region of a 3D semiconductor memory device according to exemplary embodiments of the inventive concept.

Referring to FIG. 2, a cell array of a 3D semiconductor memory device according to exemplary embodiments of the inventive concept may include a common source line CSL, a plurality of bit lines BL0 to BL2, and a plurality of cell strings CSTR connected between the common source line CSL and the bit lines BL0 to BL2.

The cell strings CSTR may be disposed on a plane defined by first and second directions D1 and D2 and may extend in a third direction D3. The bit lines BL0 to BL2 may be spaced apart from each other in the first direction D1 and may extend in the second direction D2. For example, the bit lines BL0 to BL2 may be disposed adjacent to each other in the first direction D1 and may extend lengthwise in the second direction D2.

A plurality of the cell strings CSTR may be connected in parallel to each of the bit lines BL0 to BL2. A plurality of the cell strings CSTR may be connected in common to the common source line CSL. For example, a plurality of the cell strings CSTR may be disposed between one common source line CSL and a plurality of the bit lines BL0 to BL2. The common source line CSL may be provided in plurality, and the plurality of common source lines CSL may be two-dimensionally arranged. In exemplary embodiments, the same voltage may be applied to the plurality of common source lines CSL. In exemplary embodiments, the common source lines CSL may be electrically controlled independently of each other.

In exemplary embodiments, each of the cell strings CSTR may include string selection transistors SST1 and SST2 connected in series to each other, memory cells MCT connected in series to each other, and a ground selection transistor GST. Each of the memory cells MCT may include a data storage element.

In exemplary embodiments, each of the cell strings CSTR may include first and second string selection transistors SST1 and SST2 connected in series to each other. The second string selection transistor SST2 may be connected to one of the bit lines BL0 to BL2, and the ground selection transistor GST may be connected to the common source line CSL. The memory cells MCT may be connected in series between the first string selection transistor SST1 and the ground selection transistor GST.

In addition, each of the cell strings CSTR may further include a dummy cell DMC connected between the first string selection transistor SST1 and the memory cell MCT. An additional dummy cell may be connected between the ground selection transistor GST and the memory cell MCT adjacent to the ground selection transistor GST. According to exemplary embodiments, in each of the cell strings CSTR, the ground selection transistor GST may include a plurality of MOS transistors connected in series to each other, similarly to the first and second string selection transistors SST1 and SST2. In exemplary embodiments, each of the cell strings CSTR may include a single string selection transistor.

In exemplary embodiments, the first string selection transistor SST1 may be controlled by a first string selection line SSL1, and the second string selection transistor SST2 may be controlled by a second string selection line SSL2. The memory cells MCT may be controlled by a plurality of word lines WL0 to WLn, and the dummy cell DMC may be controlled by a dummy word line DWL. The ground selection transistors GST may be controlled by ground selection lines GSL0 to GSL2. The common source line CSL may be connected in common to sources of the ground selection transistors GST.

One cell string CSTR may include the plurality of memory cells MCT respectively disposed at different distances from the common source line CSL. The word lines WL0 to WLn and DWL may be disposed between the common source line CSL and the bit lines BL0 to BL2.

Gate electrodes of the memory cells MCT (or the dummy cells) disposed at the same level from the common source line CSL may be connected in common to one of the word lines WL0 to WLn and DWL so as to be in an equipotential state. Alternatively, even though the gate electrodes of the memory cells MCT are disposed at substantially the same level from the common source line CSL, the gate electrodes disposed in one row (or one column) may be controlled independently of the gate electrodes disposed in another row (or another column).

The ground selection lines GSL0 to GSL2 and the string selection lines SSL1 and SSL2 may extend in the first direction D1 and may be spaced apart from each other in the second direction D2. For example, the ground selection lines GSL0 to GSL2 and the string selection lines SSL1 and SSL2 may extend lengthwise in the first direction D1 and may be disposed adjacent to each other in the second direction D2. The ground selection lines GSL0 to GSL2 disposed at substantially the same level from the common source line CSL may be electrically isolated from each other, and the string selection lines SSL1 or SSL2 disposed at substantially the same level from the common source line CSL may be electrically isolated from each other.

Figure 3:
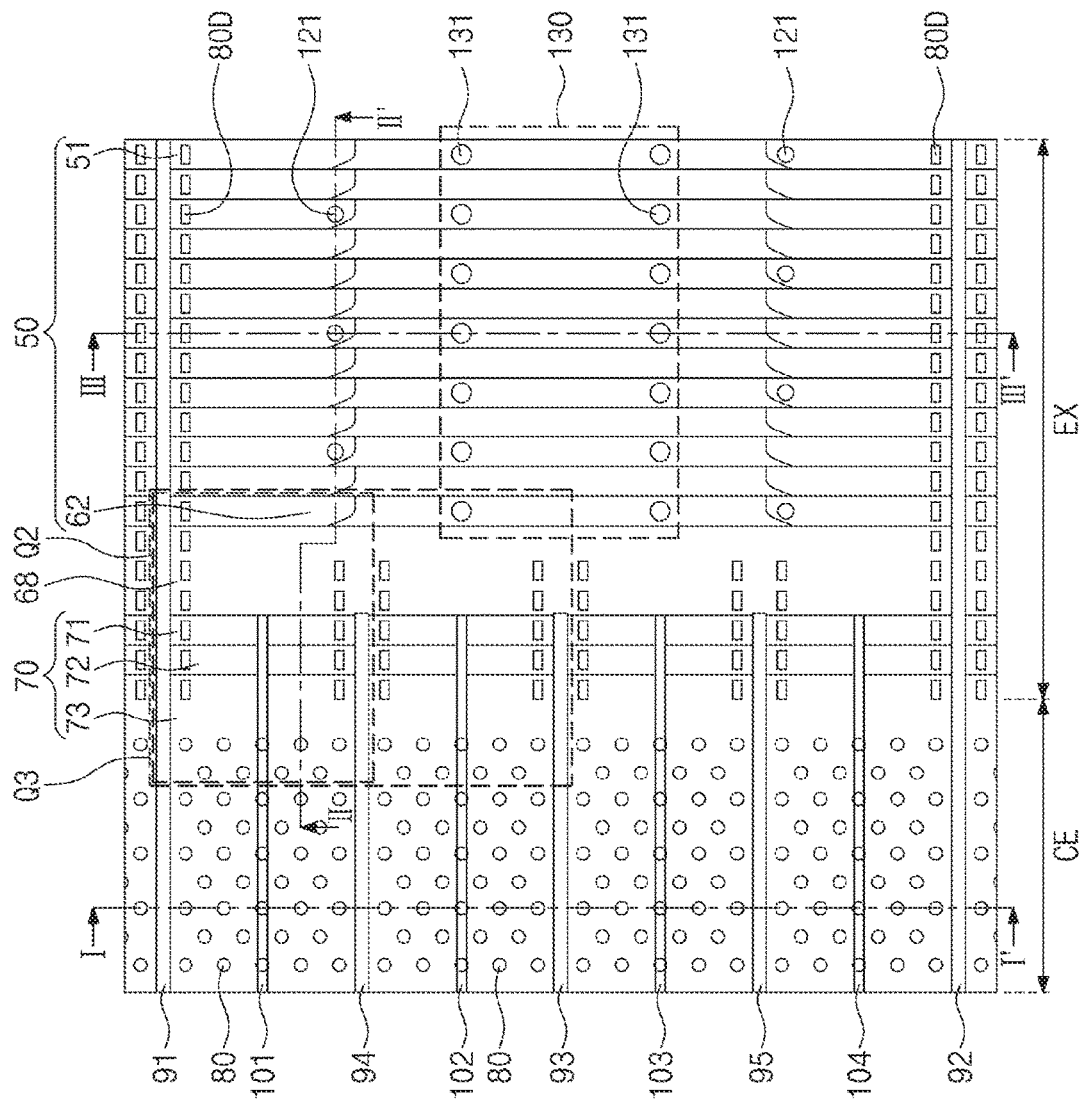
FIG. 3 is a plan view illustrating a memory cell array and a connection region according to exemplary embodiments of the inventive concept.
Figure 4:
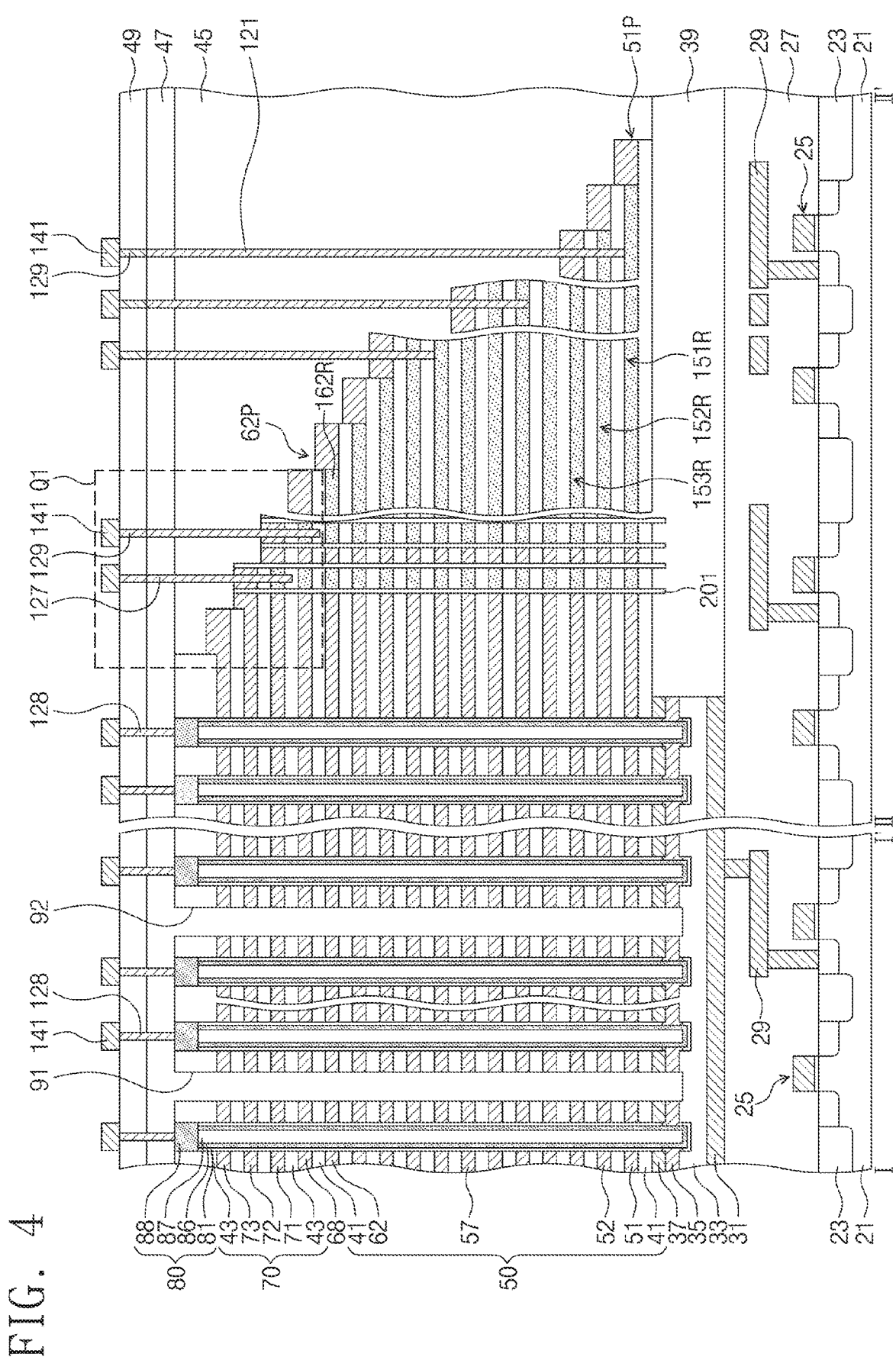
FIG. 4 is a cross-sectional view taken along lines I-I' and II-II' of FIG. 3.
Figure 5:
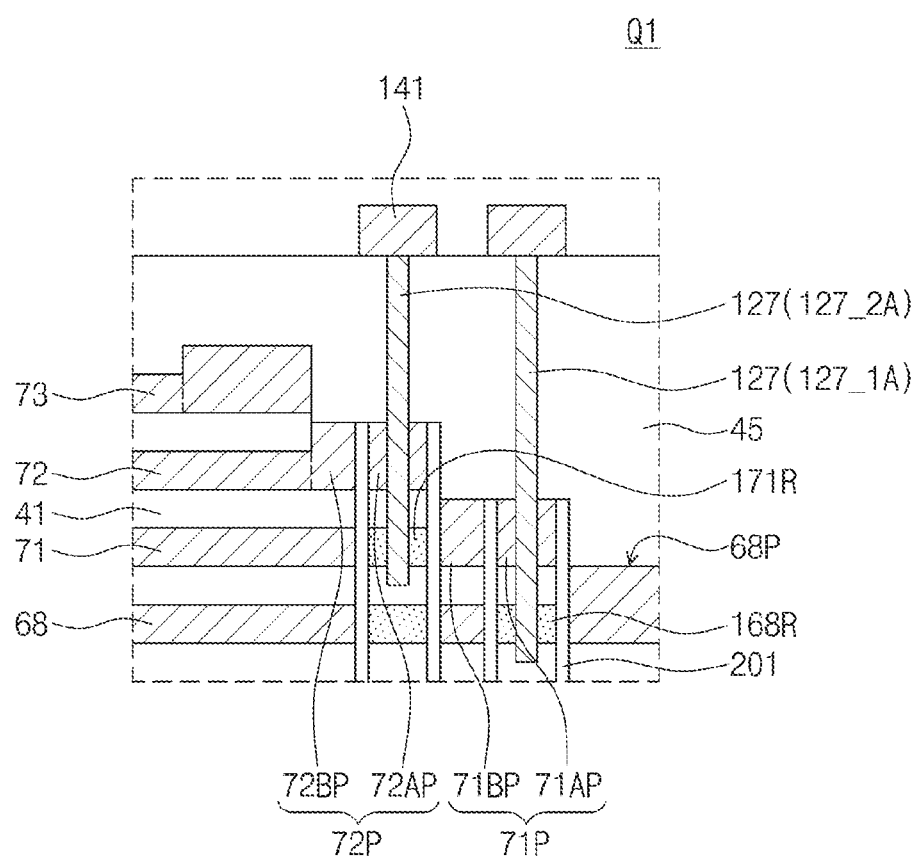
FIG. 5 is an enlarged view of region Q1 of FIG. 4.
Figure 6:
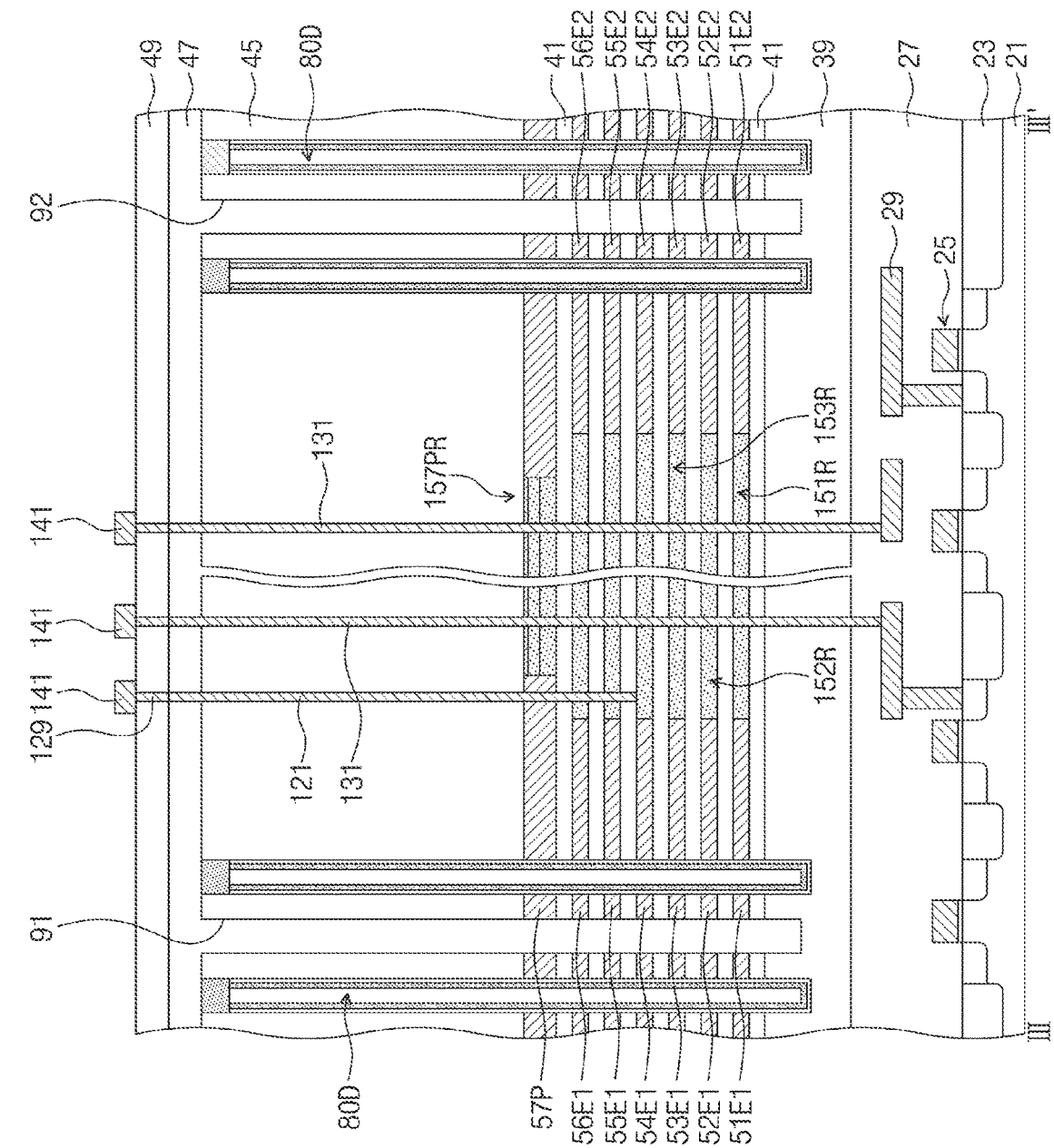
FIG. 6 is a cross-sectional view taken along line III-III' of FIG. 3.

FIG. 3 is a plan view illustrating a memory cell array and a connection region according to exemplary embodiments of the inventive concept. FIG. 4 is a cross-sectional view taken along lines I-I' and II-IF of FIG. 3. FIG. 5 is an enlarged view of region Q1 of FIG. 4. FIG. 5 may correspond to a cross-sectional view taken along line IV-IV' of FIG. 7. FIG. 6 is a cross-sectional view taken along line III-III' of FIG. 3.

Referring to FIGS. 3 to 6, a 3D semiconductor memory device according to exemplary embodiments of the inventive concept may include a cell array region CE, a connection region EX, a lower stack structure 50, a dummy electrode layer 68, an upper stack structure 70, a plurality of channel structures 80, a plurality of support structures 80D, a plurality of isolation trenches 91 to 95, a plurality of selection line isolation patterns 101 to 104, a plurality of cell contact plugs 121, a plurality of selection contact plugs 127, a through-electrode region 130, and a plurality of through-electrodes 131. The lower stack structure 50 may include a plurality of lower electrode layers 51 to 62. The upper stack structure 70 may include a plurality of upper electrode layers 71 to 73. In exemplary embodiments, each of the plurality of lower electrode layers 51 to 62 may be in contact with a corresponding at least one of the plurality of cell contact plugs 121. The plurality of lower electrode layers 51 to 62 may include at least electrode layers 51, 52, 57 and 62.

The lower stack structure 50, the dummy electrode layer 68 and the upper stack structure 70 may be defined between a first isolation trench 91 and a second isolation trench 92, which are opposite to each other. A structure between the first isolation trench 91 and the second isolation trench 92 may correspond to one of the memory blocks BLK1 to BLK3 of FIG. 1.

Herein, it will be understood that the terms "first," "second," "third," etc. are used to distinguish one element from another, and the elements are not limited by these terms. Thus, a "first" element in an exemplary embodiment may be described as a "second" element in another exemplary embodiment.

As shown in FIG. 3, a third isolation trench 93 may be disposed between the first isolation trench 91 and the second isolation trench 92. A fourth isolation trench 94 may be disposed between the first isolation trench 91 and the third isolation trench 93. A fifth isolation trench 95 may be disposed between the third isolation trench 93 and the second isolation trench 92. Each of the third, fourth and fifth isolation trenches 93, 94 and 95 may have a length shorter than that of each of the first and second isolation trenches 91 and 92. Each of the third, fourth and fifth isolation trenches 93, 94 and 95 may intersect (e.g., completely intersect) the upper stack structure 70. Each of the third, fourth and fifth isolation trenches 93, 94 and 95 may vertically penetrate the upper stack structure 70, the dummy electrode layer 68, and the lower stack structure 50.

The plurality of channel structures 80 may be disposed in the cell array region CE. The plurality of support structures 80D, the plurality of cell contact plugs 121, the plurality of selection contact plugs 127 and the through-electrode region 130 may be disposed in the connection region EX. The plurality of through-electrodes 131 may be disposed in the through-electrode region 130.

A first selection line isolation pattern 101 may be disposed between the first isolation trench 91 and the fourth isolation trench 94. A second selection line isolation pattern 102 may be disposed between the fourth isolation trench 94 and the third isolation trench 93. A third selection line isolation pattern 103 may be disposed between the third isolation trench 93 and the fifth isolation trench 95. A fourth selection line isolation pattern 104 may be disposed between the fifth isolation trench 95 and the second isolation trench 92. Each of the plurality of selection line isolation patterns 101 to 104 may intersect the cell array region CE. Each of the plurality of selection line isolation patterns 101 to 104 may vertically penetrate the upper stack structure 70. Each of the plurality of selection line isolation patterns 101 to 104 may have a length shorter than that of each of the first and second isolation trenches 91 and 92. The selection line isolation patterns 101 to 104 and horizontal isolation portions 201A connected thereto will be described in more detail below with reference to FIG. 7.

In the 3D semiconductor memory device according to exemplary embodiments of the inventive concept, a cell array structure may be provided on a peripheral logic structure which includes a substrate 21, a device isolation layer 23, a plurality of transistors 25, a lower interlayer insulating layer 27, a plurality of peripheral circuit interconnection lines 29, and a lower buried conductive layer 31. The lower stack structure 50 may include a plurality of lower insulating layers 41 and the plurality of lower electrode layers 51 to 62, which are alternately and repeatedly stacked. The upper stack structure 70 may include a plurality of upper insulating layers 43 and the plurality of upper electrode layers 71, 72 and 73, which are alternately and repeatedly stacked. Each of the plurality of channel structures 80 may include a data storage pattern 81, a channel pattern 86, a core pattern 87, and a bit pad 88. The plurality of channel structures 80 may vertically penetrate the upper stack structure 70, the dummy electrode layer 68, the lower stack structure 50, a support plate 37, and a replacement conductive line 35, and may be inserted in an upper portion of a middle buried conductive layer 33.

The data storage pattern 81 may include, for example, a tunnel insulating layer, a charge storage layer, and a blocking layer, which are sequentially stacked on the channel pattern 86. The channel pattern 86 may include a semiconductor layer such as, for example, a poly-silicon layer. The core pattern 87 may include an insulating layer or a semiconductor layer. The bit pad 88 may include a semiconductor material such as, for example, poly-silicon doped with N-type dopants.

Each of the plurality of cell contact plugs 121 may be connected to a corresponding one of the plurality of lower electrode layers 51 to 62. Each of the plurality of cell contact plugs 121 may be connected to a corresponding at least one of a plurality of lower pads 51P to 62P. Each of the plurality of cell contact plugs 121 may penetrate the connected one of the lower pads 51P to 62P and may penetrate a corresponding at least one of a plurality of lower mold patterns 151R to 162R. The plurality of lower mold patterns 151R to 162R includes lower mold patterns 152R and 153R.

At least one of the plurality of selection contact plugs 127 may be connected to one of the plurality of upper electrode layers 71, 72 and 73. For example, at least one of the plurality of selection contact plugs 127 may be connected to a corresponding one of a plurality of upper pads 71P and 72P.

As illustrated in FIG. 4 and FIG. 6, a plurality of first and second lower extension lines 51E1 to 56E1 and 51E2 to 56E2, a seventh lower pad 57P, a plurality of lower mold patterns 151R to 162R, and a lower mold pad pattern 157PR may be provided. The first lower extension lines 51E1 to 56E1 include lower extension lines 51E1, 52E1, 53E1, 54E1, 55E1 and 56E1. The second lower extension lines 51E2 to 56E2 include lower extension lines 51E2, 52E2, 53E2, 54E2, 55E2 and 56E2. Although the exemplary embodiment of FIG. 5 includes one lower mold pad pattern 157PR, the inventive concept is not limited thereto. For example, in exemplary embodiments, a lower mold pad pattern may also be provided at the same level as each of other lower electrode layers 51 to 56 and 58 to 62. The lower mold pad pattern 157PR may be a remaining mold layer in a pad region to be described later.

For example, one of the plurality of through-electrodes 131 may penetrate the lower mold pad pattern 157PR and may penetrate at least one of the plurality of lower mold patterns 151R to 162R disposed under the lower mold pad pattern 157PR.

A middle interlayer insulating layer 39 disposed on the lower interlayer insulating layer 27 may include a plurality of insulating layers. For example, the middle interlayer insulating layer 39 may include at least one silicon nitride layer disposed between a plurality of silicon oxide layers. The cell contact plug 121 may penetrate a first insulating layer 47 and an upper interlayer insulating layer 45 so as to be connected to the seventh lower pad 57P. For example, the cell contact plug 121 may penetrate the seventh lower pad 57P and may penetrate corresponding two of the plurality of lower mold patterns 151R to 162R.

Each of the plurality of support structures 80D may have similar components (or a similar structure) to those of each of the plurality of channel structures 80. As illustrated in FIG. 3, The plurality of support structures 80D may penetrate the upper stack structure 70, the dummy electrode layer 68, and the lower stack structure 50, and may be inserted in an upper portion of the middle interlayer insulating layer 39.

Hereinafter, the upper electrode layers 71, 72 and 73, the dummy electrode layer 68, and an uppermost one 62 of the lower electrode layers 51 to 62 will be described in more detail with reference to FIGS. 4 to 11.

Figure 7:
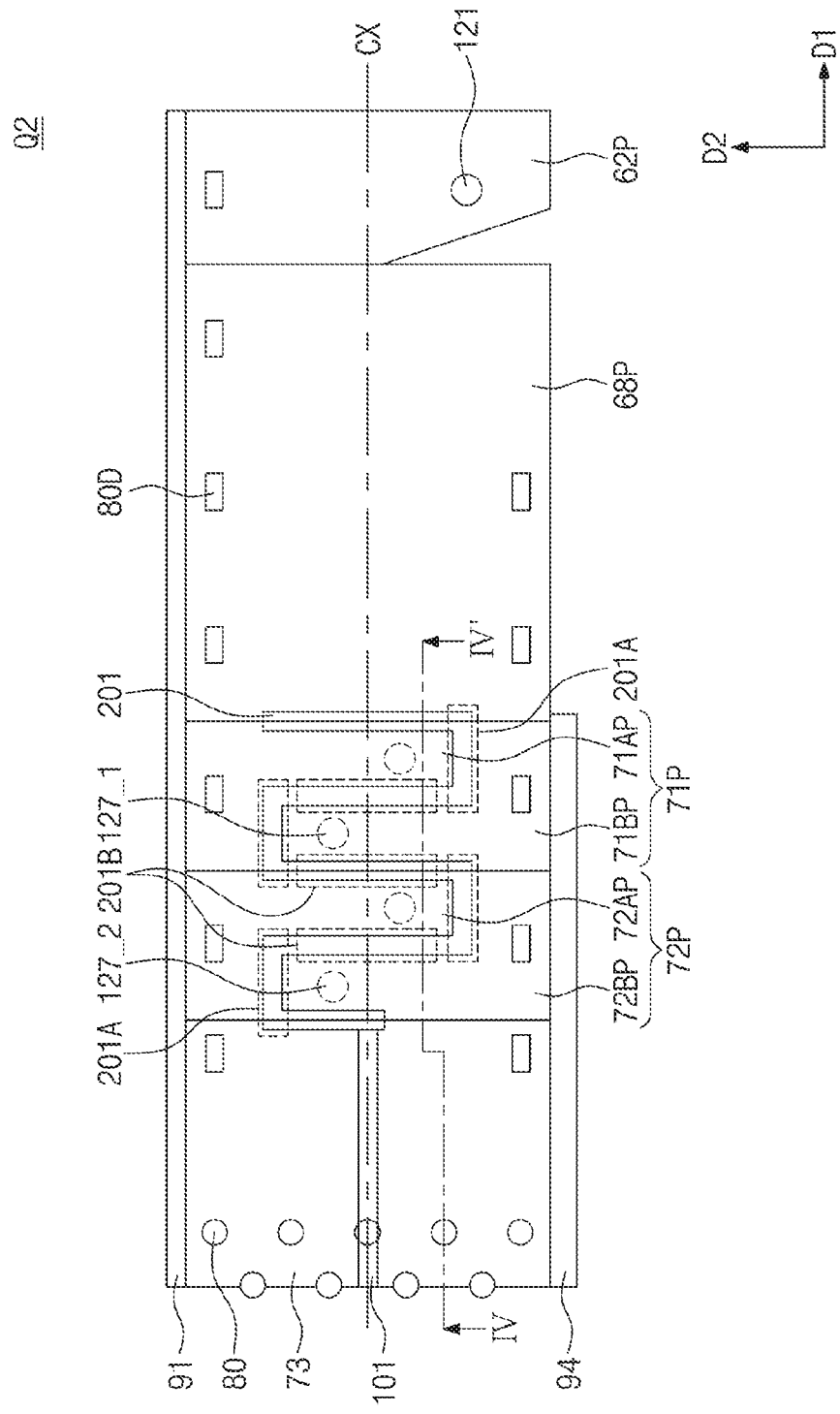
FIG. 7 is an enlarged view of region Q2 of FIG. 3 according to exemplary embodiments of the inventive concept.

FIG. 7 is an enlarged view of region Q2 of FIG. 3 according to exemplary embodiments of the inventive concept. FIGS. 8, 9, 10 and 11 are plan views illustrating a second upper electrode layer 72, a first upper electrode layer 71, a dummy electrode layer 68, and an uppermost lower electrode layer 62 according to exemplary embodiments of FIG. 7, respectively.

Referring to FIGS. 4 to 11, each of the upper electrode layers 71, 72 and 73 may be divided into segments horizontally spaced apart from each other. For example, each of the upper electrode layers 71, 72 and 73 may be divided in a second direction D2 by a middle isolation trench and a horizontal isolation pattern 201 connected to the middle isolation trench. Herein, a middle isolation trench may refer to an isolation trench relatively disposed between two adjacent trenches. The first selection line isolation pattern 101 may be provided in the middle isolation trench and may be connected to the horizontal isolation pattern 201. A height of a bottom surface of the first selection line isolation pattern 101 may be between the first upper electrode layer 71 and the dummy electrode layer 68. For example, in an exemplary embodiment, the first selection line isolation pattern 101 may fill the middle isolation trench, and a bottom surface of the selection line isolation pattern 101 may be higher than a topmost surface of the lower stack structure 50. The horizontal isolation pattern 201 may penetrate the lower stack structure 50 and may be inserted in an upper portion of the middle interlayer insulating layer 39. Alternatively, a bottom surface of the horizontal isolation pattern 201 may be disposed at substantially the same level as the bottom surface of the first selection line isolation pattern 101.

As illustrated in FIG. 3 and FIG. 7, the isolation trenches 91 and 93 extend in the first direction D1 and are spaced apart from each other in the second direction D2. For example, the isolation trenches 91 and 93 extend lengthwise in the first direction D1 and are disposed adjacent to each other in the second direction D2. Further, the middle isolation trench 94 is disposed between the isolation trenches 91 and 93 and extends in the first direction D1.

The horizontal isolation pattern 201 may include horizontal isolation portions 201A, each of which is offset from an extension line CX of the middle isolation trench (for example, the first selection line isolation pattern 101) in the second direction D2 or an opposite direction to the second direction D2. For example, the extension line CX may be a center line between the first isolation trench 91 and the fourth isolation trench 94. The extension line CX is an imaginary line having a location corresponding to the portion of the middle isolation trench that extends lengthwise in the first direction D1. For example, in FIG. 7, the extension line CX extends along the lengthwise portion of the first selection line isolation pattern 101 that extends in a first direction D1. Each of the horizontal isolation portions 201A may extend in the first direction D1. For example, each of the horizontal isolation portions 201A may extend lengthwise in the first direction D1. The horizontal isolation pattern 201 may include vertical isolation portions 201B extending in the second direction D2 (e.g., extending lengthwise in the second direction D2). The vertical isolation portions 201B may be connected to the horizontal isolation portions 201A.

Each of the horizontal isolation portions 201A may be symmetrically offset from the extension line CX in the second direction D2 or an opposite direction to the second direction D2. In exemplary embodiments, the horizontal isolation portions 201A may be repeatedly and alternately symmetrically offset from the extension line CX in the second direction D2 and in the opposite direction to the second direction D2. For example, the horizontal isolation portions 201A may be arranged in a zigzag pattern with the extension line CX interposed therebetween.

Figure 8:
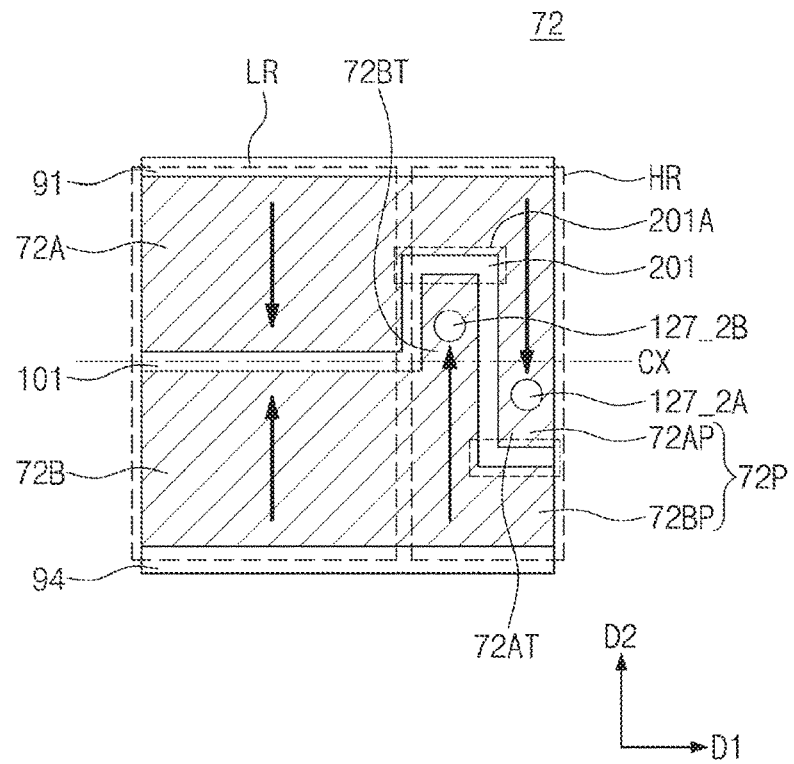
FIGS. 8, 9, 10 and 11 are plan views illustrating a second upper electrode layer, a first upper electrode layer, a dummy electrode layer, and an uppermost lower electrode layer according to exemplary embodiments of FIG. 7, respectively.

As illustrated in FIGS. 7 and 8, the second upper electrode layer 72 may include an upper electrode layer 72A and an upper electrode layer 72B, which are separated or isolated from each other by the first selection line isolation pattern 101 and the horizontal isolation pattern 201. The upper electrode layer 72A and the upper electrode layer 72B may include a non-pad region LR disposed under a third upper electrode layer 73 on the second upper electrode layer 72, and a pad region HR exposed by the third upper electrode layer 73. The pad region HR may be a region exposed by an electrode layer disposed thereon, and the non-pad region LR may be a remaining region except for the pad region HR. The upper electrode layer 72A and the upper electrode layer 72B may include an upper pad 72AP and an upper pad 72BP in end portions thereof (i.e., in the pad region HR), respectively. The upper pad 72AP and the upper pad 72BP may be collectively referred to as a second upper pad 72P.

Due to a shape of the horizontal isolation pattern 201, the upper pad 72BP may have a pad protrusion 72BT protruding in the second direction D2, and the upper pad 72AP may have a pad protrusion 72AT protruding in the opposite direction to the second direction D2. Arrows in FIGS. 8 to 11 indicate horizontal distances by which mold layers are removed in a removal process of the mold layers to be described later (see FIGS. 33 and 34). For example, the arrows in FIG. 8 indicate that a second upper mold layer 172 (see FIGS. 31 and 32) is removed. An etchant provided through the isolation trenches 91 and 94 may horizontally move to perform the removal of the second upper mold layer 172. The etchant may remove the second upper mold layer 172 by the same distance from each of the isolation trenches 91 and 94. The removal of the second upper mold layer 172 by the etchant may be spatially limited by the first selection line isolation pattern 101 and the horizontal isolation pattern 201.

As described further below with reference to a manufacturing method according to exemplary embodiments of the inventive concept, a removal rate of the mold layers may be higher in the pad region HR than in the non-pad region LR. In the non-pad region LR, the etchant may remove the second upper mold layer 172 while moving to the extension line CX. Thus, the second upper mold layer 172 may be substantially completely removed in the non-pad region LR. In the pad region HR, the etchant provided from each of the isolation trenches 91 and 94 may move beyond the extension line CX for the same time as an etching time in the non-pad region LR to remove the second upper mold layer 172. For example, the etchant may reach the horizontal isolation portions 201A. As a result, the second upper mold layer 172 may be substantially completely removed in the pad region HR. Thus, the pad protrusions 72BT and 72AT may be formed to fill gap regions formed in the pad region HR. Pad protrusions of other electrode layers may be formed by a similar method to the above-described method, as described below.

Second selection contact plugs 127_2A and 127_2B (hereinafter referred to as 127_2) may be connected to the pad protrusions 72AT and 72BT, respectively. Each of the second selection contact plugs 127_2 may penetrate each of the pad protrusions 72AT and 72BT so as to be in contact with a first upper mold pattern 171R. For example, the second selection contact plugs 127_2 may penetrate the first upper mold pattern 171R.

Figure 9:
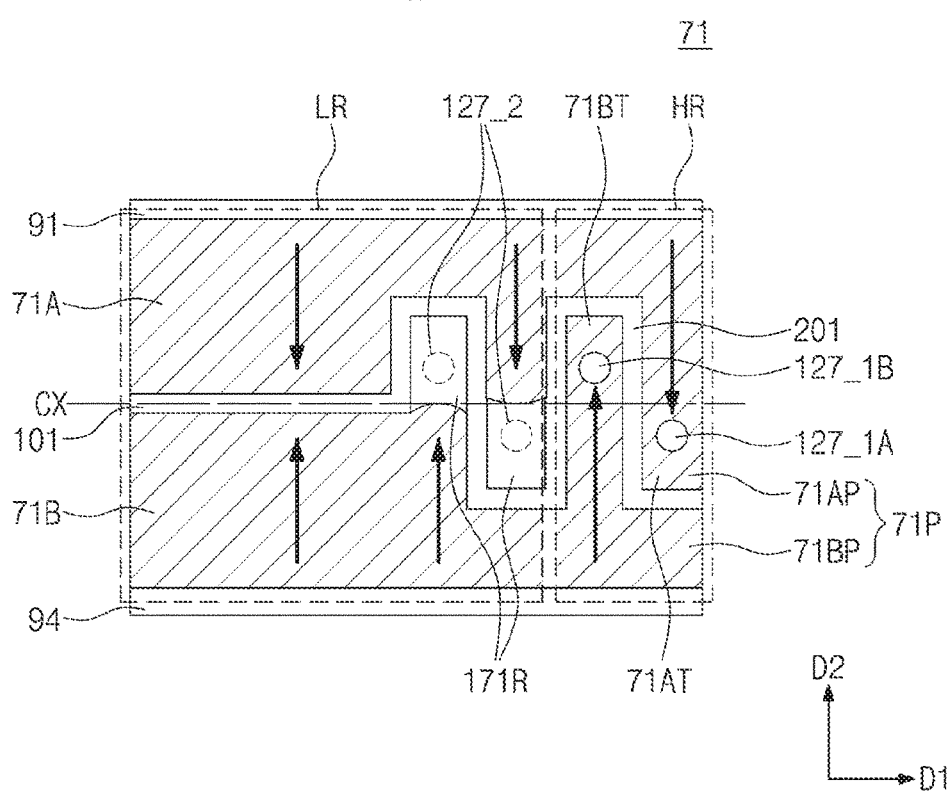

As illustrated in FIGS. 7 and 9, the first upper electrode layer 71 may include an upper electrode layer 71A and an upper electrode layer 71B, which are separated or isolated from each other by the first selection line isolation pattern 101 and the horizontal isolation pattern 201. The upper electrode layer 71A and the upper electrode layer 71B may include a non-pad region LR disposed under the second upper electrode layer 72 on the first upper electrode layer 71, and a pad region HR exposed by the second upper electrode layer 72. The upper electrode layer 71A and the upper electrode layer 71B may include an upper pad 71AP and an upper pad 71BP in end portions thereof (i.e., in the pad region HR), respectively. The upper pad 71AP and the upper pad 71BP may be referred to as a first upper pad 71P.

Due to the shape of the horizontal isolation pattern 201, the upper pad 71BP may have a pad protrusion 71BT protruding in the second direction D2, and the upper pad 71AP may have a pad protrusion 71AT protruding in the opposite direction to the second direction D2. The arrows in FIG. 9 indicate that a first upper mold layer 171 (see FIGS. 31 and 32) is removed.

As described above, the removal rate of the mold layers may be higher in the pad region HR than in the non-pad region LR. In the non-pad region LR, the etchant may remove the first upper mold layer 171 while moving to the extension line CX. At this time, the movement of the etchant may be stopped by the horizontal isolation pattern 201, and thus, a portion of the first upper mold layer 171 may remain to form the first upper mold pattern 171R. For example, the first upper mold pattern 171R may include a plurality of regions separated from each other. In the pad region HR, the etchant provided from each of the isolation trenches 91 and 94 may move beyond the extension line CX for the same time as an etching time in the non-pad region LR to remove the first upper mold layer 171. As a result, the first upper mold layer 171 may be substantially completely removed in the pad region HR. Thus, the pad protrusions 71BT and 71AT may be formed to fill gap regions formed in the pad region HR. In exemplary embodiments, an upper mold pad pattern may be formed in the pad region HR.

First selection contact plugs 127_1A and 127_1B (hereinafter referred to as 127_1) may be connected to the pad protrusions 71AT and 71BT, respectively. Each of the first selection contact plugs 127_1 may penetrate each of the pad protrusions 71AT and 71BT so as to be in contact with a dummy mold pattern 168R. For example, the first selection contact plugs 127_1 may penetrate the dummy mold pattern 168R, and the second selection contact plugs 127_2 may penetrate the first upper mold pattern 171R. As a result, the second selection contact plugs 127_2 may be electrically isolated from the first upper electrode layer 71.

Figure 10:
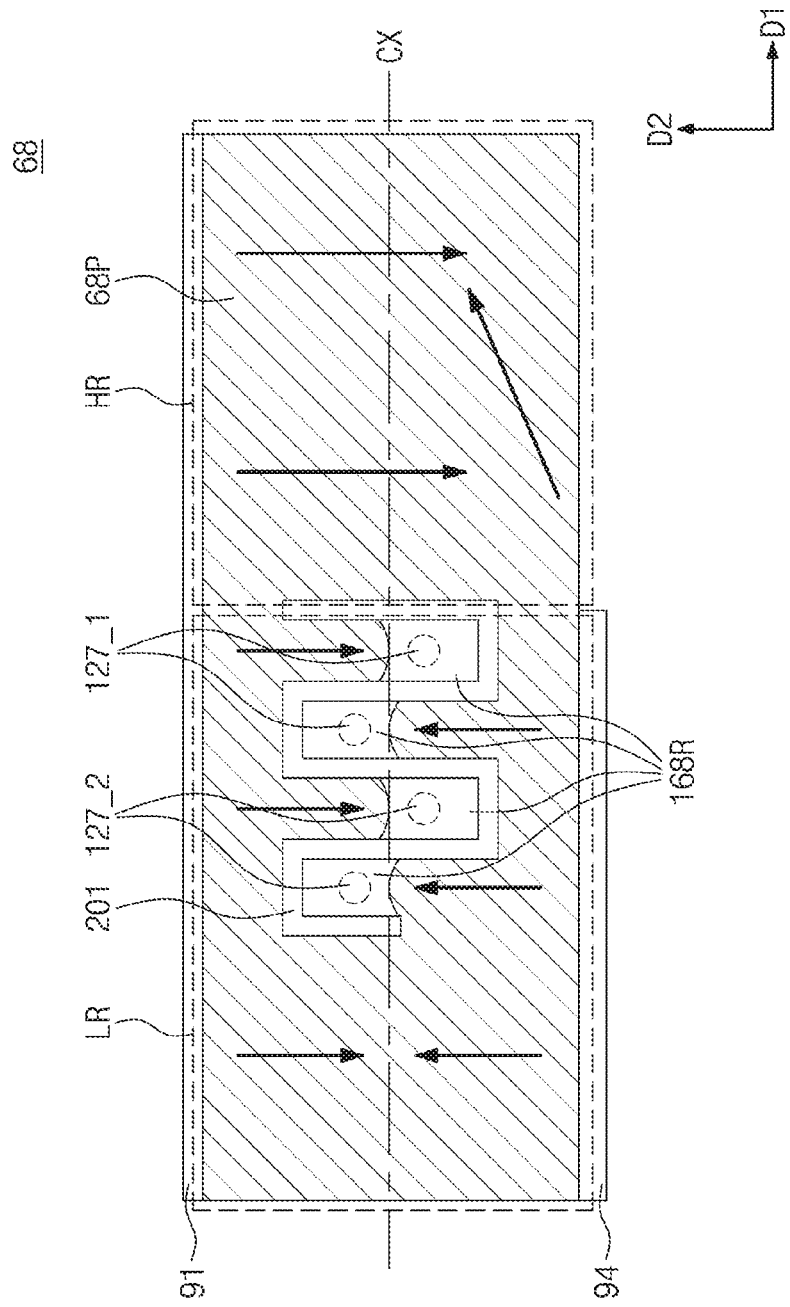

As illustrated in FIGS. 7 and 10, the horizontal isolation pattern 201 may penetrate the dummy electrode layer 68. The bottom surface of the first selection line isolation pattern 101 may be higher than a top surface of the dummy electrode layer 68, and thus, in exemplary embodiments, the first selection line isolation pattern 101 does not penetrate the dummy electrode layer 68. The dummy electrode layer 68 may include a non-pad region LR disposed under the first upper electrode layer 71 disposed thereon, and a pad region HR exposed by the first upper electrode layer 71. The dummy electrode layer 68 may include a dummy pad 68P in its end portion (i.e., in the pad region HR).

The arrows in FIG. 10 indicate that a dummy mold layer 168 is removed. In the non-pad region LR, the etchant may remove the dummy mold layer 168 while moving to the extension line CX. At this time, the movement of the etchant may be stopped by the horizontal isolation pattern 201 to form a dummy mold pattern 168R from the dummy mold layer 168. In the pad region HR, the etchant provided from each of the isolation trenches 91 and 94 may move beyond the extension line CX for the same time as an etching time in the non-pad region LR to remove the dummy mold layer 168. As a result, the dummy mold layer 168 may be substantially completely removed in the pad region HR. Thus, the dummy pad 68P may be formed to fill a gap region formed in the pad region HR. In exemplary embodiments, a dummy mold pad pattern may be formed in the pad region HR.

The first selection contact plugs 127_1 and the second selection contact plugs 127_2 may penetrate the dummy mold pattern 168R. As a result, the first selection contact plugs 127_1 and the second selection contact plugs 127_2 may be electrically isolated from the dummy electrode layer 68.

Figure 11:
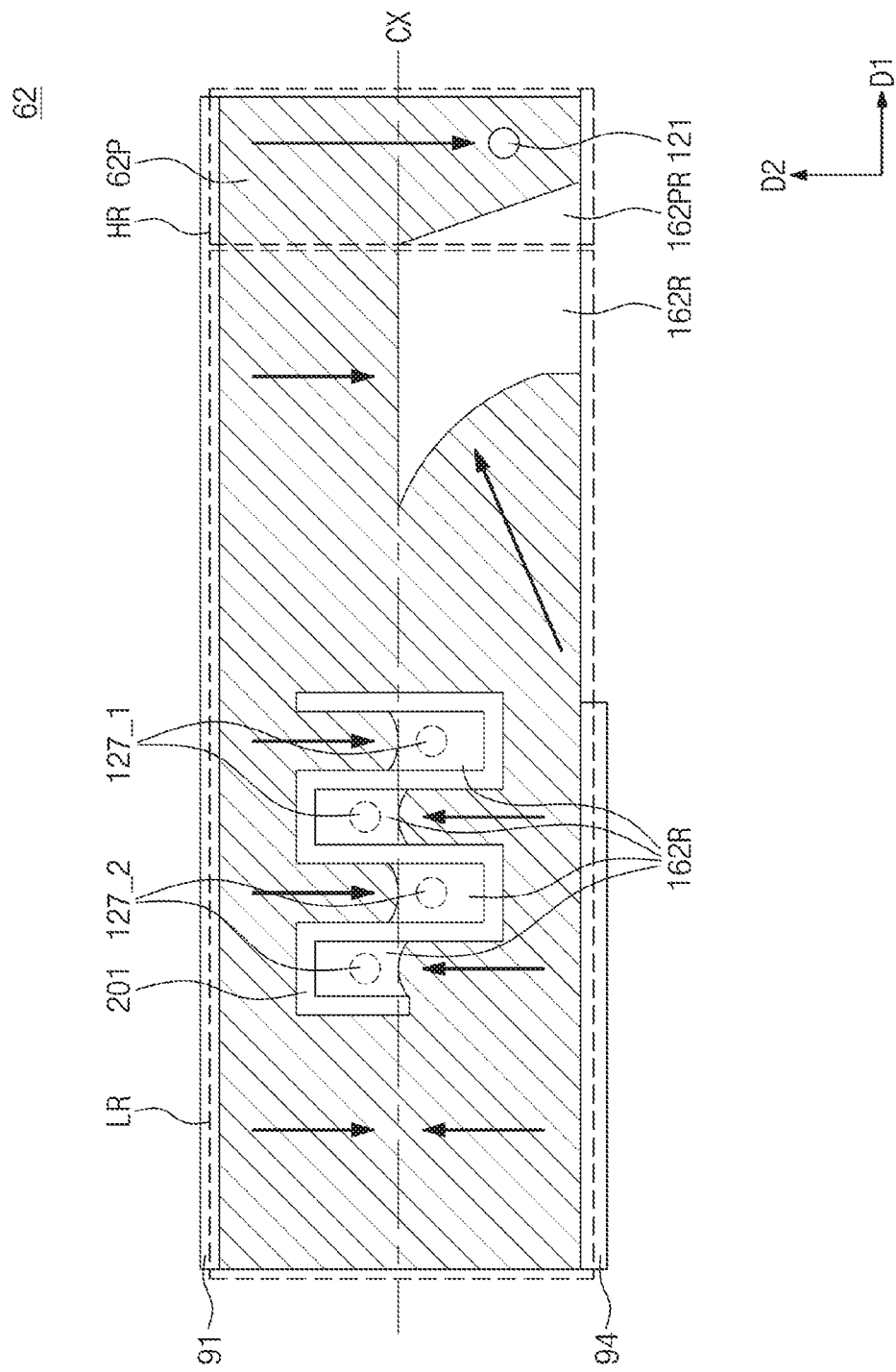

As illustrated in FIGS. 7 and 11, the horizontal isolation pattern 201 may penetrate the uppermost lower electrode layer 62. The bottom surface of the first selection line isolation pattern 101 may be higher than a top surface of the uppermost lower electrode layer 62. Thus, in exemplary embodiments, the first selection line isolation pattern 101 does not penetrate the uppermost lower electrode layer 62. The uppermost lower electrode layer 62 may include a non-pad region LR disposed under the dummy electrode layer 68 disposed thereon, and a pad region HR exposed by the dummy electrode layer 68. The uppermost lower electrode layer 62 may include an uppermost lower pad 62P in its end portion (i.e., in the pad region HR).

The arrows in FIG. 11 indicate that an uppermost lower mold layer 162 is removed. In the non-pad region LR, the etchant may remove the uppermost lower mold layer 162 while moving to the extension line CX. At this time, the movement of the etchant may be stopped by the horizontal isolation pattern 201 to form an uppermost lower mold pattern 162R from the uppermost lower mold layer 162. In the pad region HR, the etchant provided from the first isolation trench 91 may move beyond the extension line CX for the same time as an etching time in the non-pad region LR to remove the uppermost lower mold layer 162. Thus, the uppermost lower pad 62P may be formed to fill a gap region formed in the pad region HR. A portion (e.g., a preliminary pad 162P of FIG. 31) of the uppermost lower mold layer 162 may remain in the pad region HR to form an uppermost lower mold pad pattern 162PR.

The cell contact plug 121 may penetrate the uppermost lower pad 62P. For example, the cell contact plug 121 may also penetrate at least one mold pattern disposed under the uppermost lower pad 62P. The first selection contact plugs 127_1 and the second selection contact plugs 127_2 may penetrate the uppermost lower mold pattern 162R. As a result, the first selection contact plugs 127_1 and the second selection contact plugs 127_2 may be electrically isolated from the uppermost lower electrode layer 62.

Figure 12:
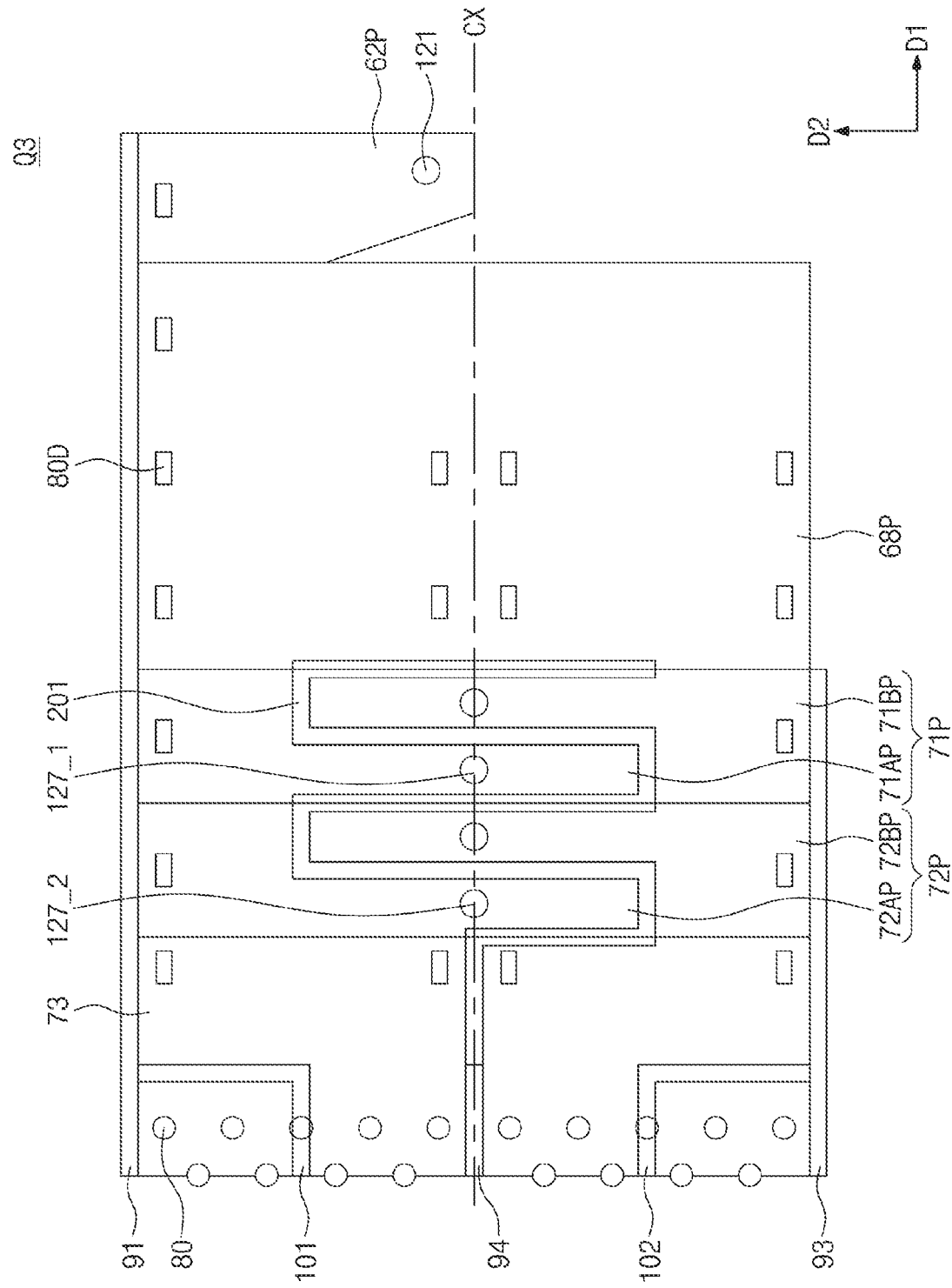
FIG. 12 is an enlarged view of region Q3 of FIG. 3 according to exemplary embodiments of the inventive concept.

FIG. 12 is an enlarged view of region Q3 of FIG. 3 according to exemplary embodiments of the inventive concept. FIGS. 13, 14, 15 and 16 are plan views illustrating a second upper electrode layer 72, a first upper electrode layer 71, a dummy electrode layer 68, and an uppermost lower electrode layer 62 according to exemplary embodiments of FIG. 12, respectively. Hereinafter, for convenience of explanation, a further description of elements and technical aspects previously described may be omitted.

Referring to FIGS. 12 to 16, each of upper electrode layers 71, 72 and 73 may be provided between the first isolation trench 91 and the third isolation trench 93, and may be divided into segments horizontally spaced apart from each other. For example, each of the upper electrode layers 71, 72 and 73 may be divided in a second direction D2 by a middle isolation trench and a horizontal isolation pattern 201 connected to the middle isolation trench. The middle isolation trench may be the fourth isolation trench 94. The middle isolation trench 94 may penetrate the upper stack structure 70 between adjacent isolation trenches. As described with reference to FIG. 7, the horizontal isolation pattern 201 may include horizontal isolation portions 201A and vertical isolation portions 201B.

As illustrated in FIG. 12, the isolation trenches 91 and 93 extend in a first direction D1 and are spaced apart from each other in the second direction D2. For example, the isolation trenches 91 and 93 extend lengthwise in the first direction D1 and are disposed adjacent to each other in the second direction D2. Further, the middle isolation trench 94 is disposed between the isolation trenches 91 and 93 and extends in the first direction D1.

In FIG. 12, the extension line CX is an imaginary line having a location corresponding to the portion of the middle isolation trench 94 that extends lengthwise in the first direction D1. The horizontal isolation pattern 201 includes horizontal isolation portions, each of which may be symmetrically offset from the extension line CX in the second direction D2 or an opposite direction to the second direction D2. In exemplary embodiments, the horizontal isolation portions may be repeatedly and alternately symmetrically offset from the extension line CX in the second direction D2 and in the opposite direction to the second direction D2.

Figure 13:
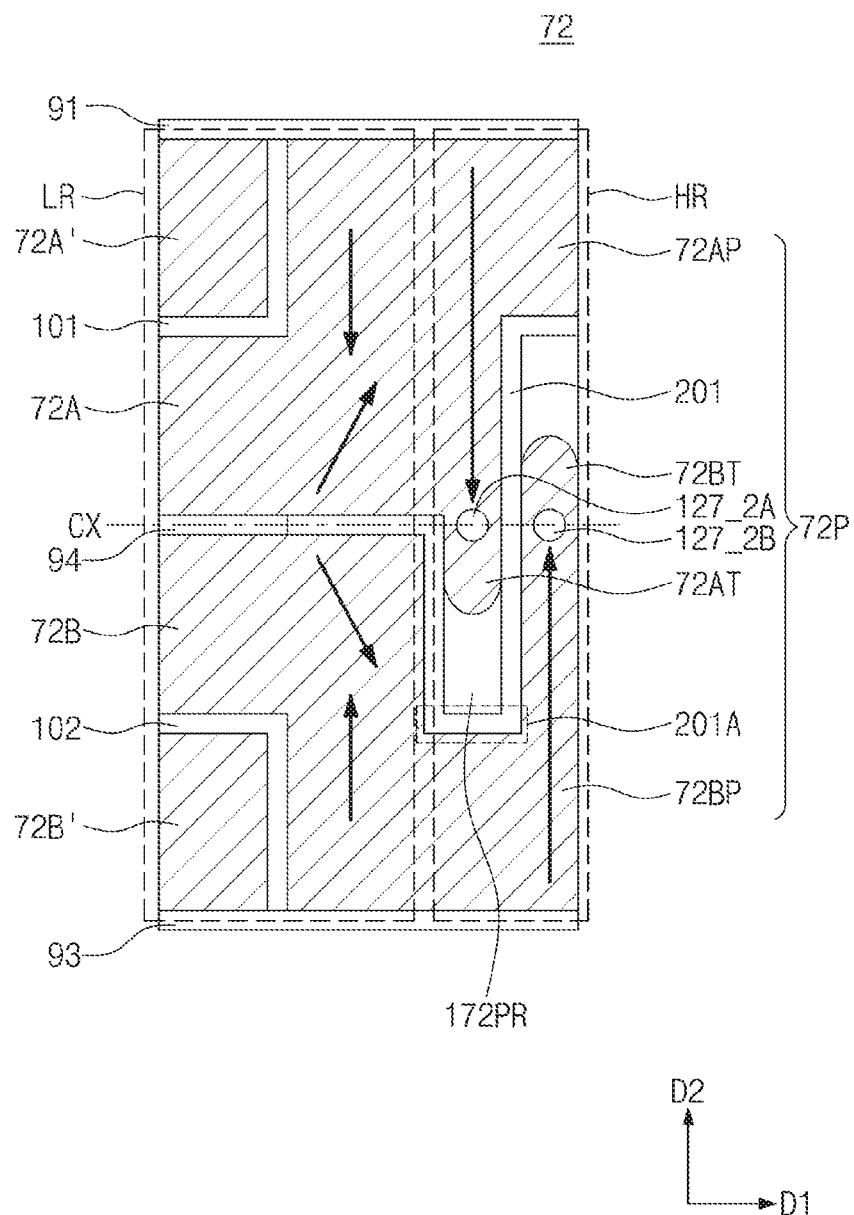
FIGS. 13, 14, 15 and 16 are plan views illustrating a second upper electrode layer, a first upper electrode layer, a dummy electrode layer, and an uppermost lower electrode layer according to exemplary embodiments of FIG. 12, respectively.

As illustrated in FIGS. 12 and 13, a second upper electrode layer 72 may include an upper electrode layer 72A and an upper electrode layer 72B, which are separated or isolated from each other. The upper electrode layer 72A and the upper electrode layer 72B may include a non-pad region LR disposed under a third upper electrode layer 73 on the second upper electrode layer 72, and a pad region HR exposed by the third upper electrode layer 73. The upper electrode layer 72A and the upper electrode layer 72B may include an upper pad 72AP and an upper pad 72BP in end portions thereof (i.e., in the pad region HR), respectively. A first selection line isolation pattern 101 may separate the upper electrode layer 72A and an upper electrode layer 72A' from each other. A second selection line isolation pattern 102 may separate the upper electrode layer 72B and an upper electrode layer 72B' from each other.

Due to a shape of the horizontal isolation pattern 201, the upper pad 72BP may have a pad protrusion 72BT protruding in the second direction D2, and the upper pad 72AP may have a pad protrusion 72AT protruding in an opposite direction to the second direction D2. Arrows in FIG. 13 indicate that a second upper mold layer 172 (see FIGS. 31 and 32) is removed. An etchant may remove the second upper mold layer 172 by the same distance from each of the isolation trenches 91, 93 and 94. The removal of the second upper mold layer 172 by the etchant may be spatially limited by the selection line isolation patterns 101 and 102 and the horizontal isolation pattern 201.

The etchant may substantially completely remove the second upper mold layer 172 in the non-pad region LR. In the pad region HR, the etchant provided from each of the isolation trenches 91, 93 and 94 may move beyond an extension line CX of the fourth isolation trench 94 for the same time as an etching time in the non-pad region LR to remove the second upper mold layer 172. In exemplary embodiments, a second upper mold pad pattern 172PR may be formed from the second upper mold layer 172. Alternatively, the second upper mold layer 172 may be substantially completely removed in the pad region HR. The pad protrusions 72BT and 72AT may be formed to fill gap regions formed in the pad region HR. Second selection contact plugs 127_2 may be connected to the pad protrusions 72AT and 72BT, respectively.

Figure 14:
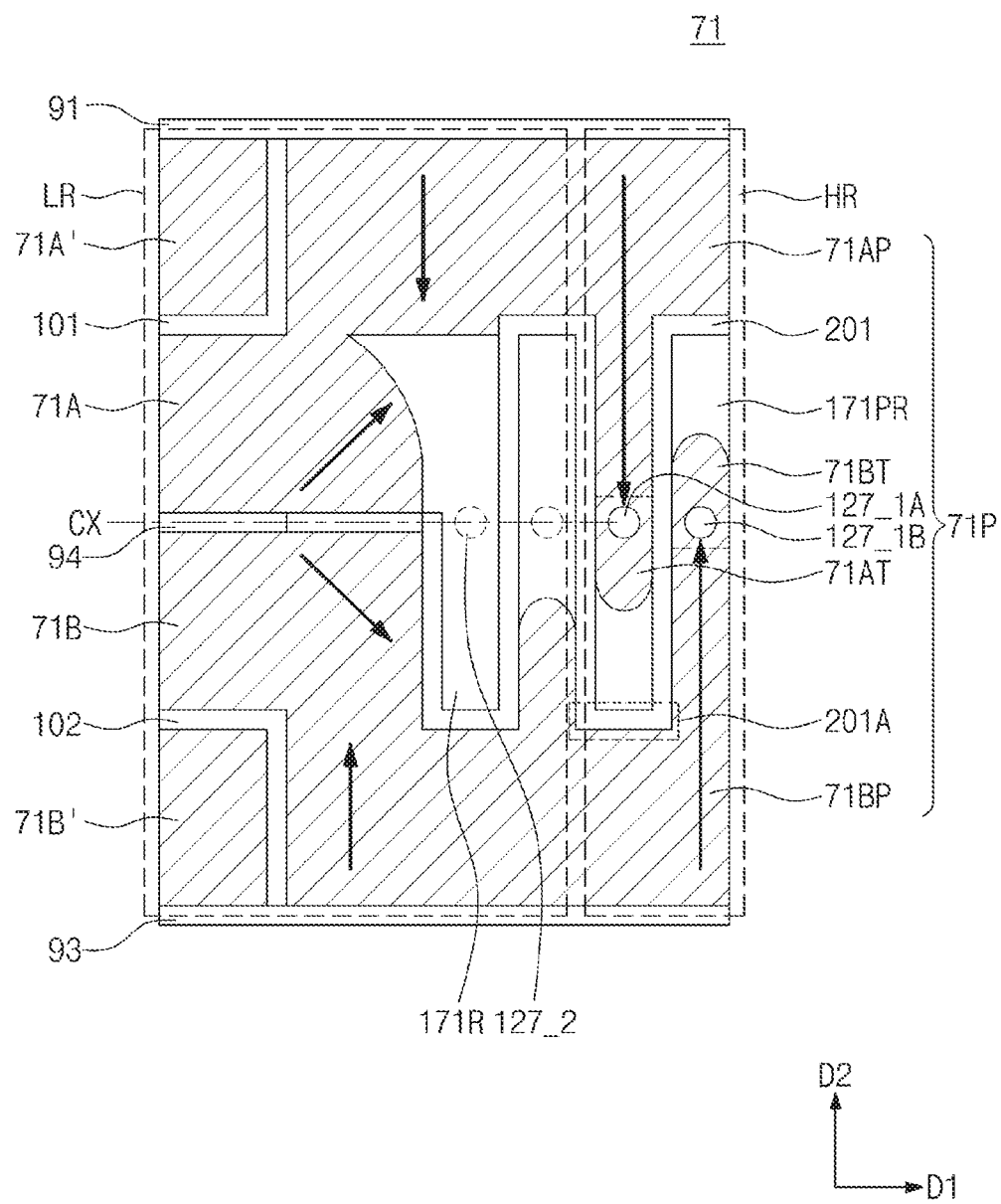

As illustrated in FIGS. 12 and 14, a first upper electrode layer 71 may include an upper electrode layer 71A and an upper electrode layer 71B, which are separated or isolated from each other. The upper electrode layer 71A and the upper electrode layer 71B may include a non-pad region LR disposed under the second upper electrode layer 72 on the first upper electrode layer 71, and a pad region HR exposed by the second upper electrode layer 72. The upper electrode layer 71A and the upper electrode layer 71B may include an upper pad 71AP and an upper pad 71BP in the pad region HR, respectively.

Due to the shape of the horizontal isolation pattern 201, the upper pad 71BP may have a pad protrusion 71BT protruding in the second direction D2, and the upper pad 71AP may have a pad protrusion 71AT protruding in the opposite direction to the second direction D2. Arrows in FIG. 14 indicate that a first upper mold layer 171 (see FIGS. 31 and 32) is removed. In the non-pad region LR, a first upper mold pattern 171R may remain at a relatively far distance from the isolation trenches 91, 93 and 94. In the pad region HR, the etchant provided from each of the isolation trenches 91, 93 and 94 may move beyond the extension line CX of the fourth isolation trench 94 to remove the first upper mold layer 171. In exemplary embodiments, a first upper mold pad pattern 171PR may be formed in the pad region HR. Alternatively, the first upper mold layer 171 may be substantially completely removed in the pad region HR. The pad protrusions 71BT and 71AT may be formed to fill gap regions formed in the pad region HR.

First selection contact plugs 127_1 may be connected to the pad protrusions 71AT and 71BT, respectively. Each of the first selection contact plugs 127_1 may penetrate each of the pad protrusions 71AT and 71BT so as to be in contact with a dummy mold pattern 168R. For example, the first selection contact plugs 127_1 may penetrate the dummy mold pattern 168R and the second selection contact plugs 127_2 may penetrate the first upper mold pattern 171R. As a result, the second selection contact plugs 127_2 may be electrically isolated from the first upper electrode layer 71.

Figure 15:
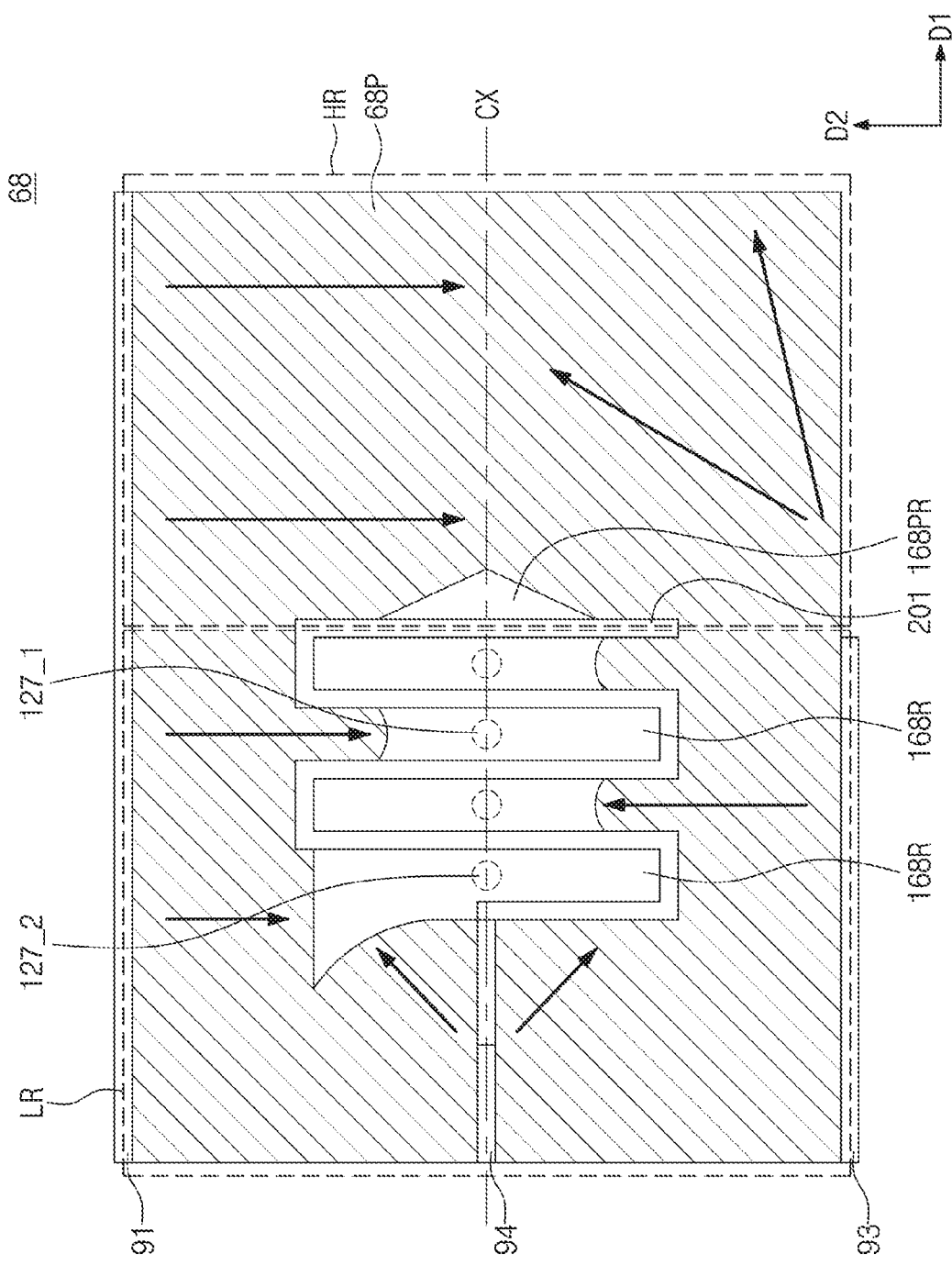

As illustrated in FIGS. 12 and 15, the horizontal isolation pattern 201 may penetrate the dummy electrode layer 68. Bottom surfaces of the selection line isolation patterns 101 and 102 may be higher than a top surface of the dummy electrode layer 68. Thus, in exemplary embodiments, the selection line isolation patterns 101 and 102 do not penetrate the dummy electrode layer 68. The dummy electrode layer 68 may include a non-pad region LR disposed under the first upper electrode layer 71 disposed thereon, and a pad region HR exposed by the first upper electrode layer 71. The dummy electrode layer 68 may include a dummy pad 68P in its end portion (i.e., in the pad region HR).

Arrows in FIG. 15 indicate that a dummy mold layer 168 is removed. In the non-pad region LR, a dummy mold pattern 168R may be formed at a relatively far distance from the isolation trenches 91, 93 and 94. In the pad region HR, the etchant provided from each of the isolation trenches 91, 93 and 94 may remove the dummy mold layer 168 to the extension line CX. In exemplary embodiments, a dummy mold pad pattern 168PR may be formed in the pad region HR. The dummy pad 68P may be formed to fill a gap region formed in the pad region HR.

The first selection contact plugs 127_1 and the second selection contact plugs 127_2 may penetrate the dummy mold pattern 168R. As a result, the first selection contact plugs 127_1 and the second selection contact plugs 127_2 may be electrically isolated from the dummy electrode layer 68.

Figure 16:
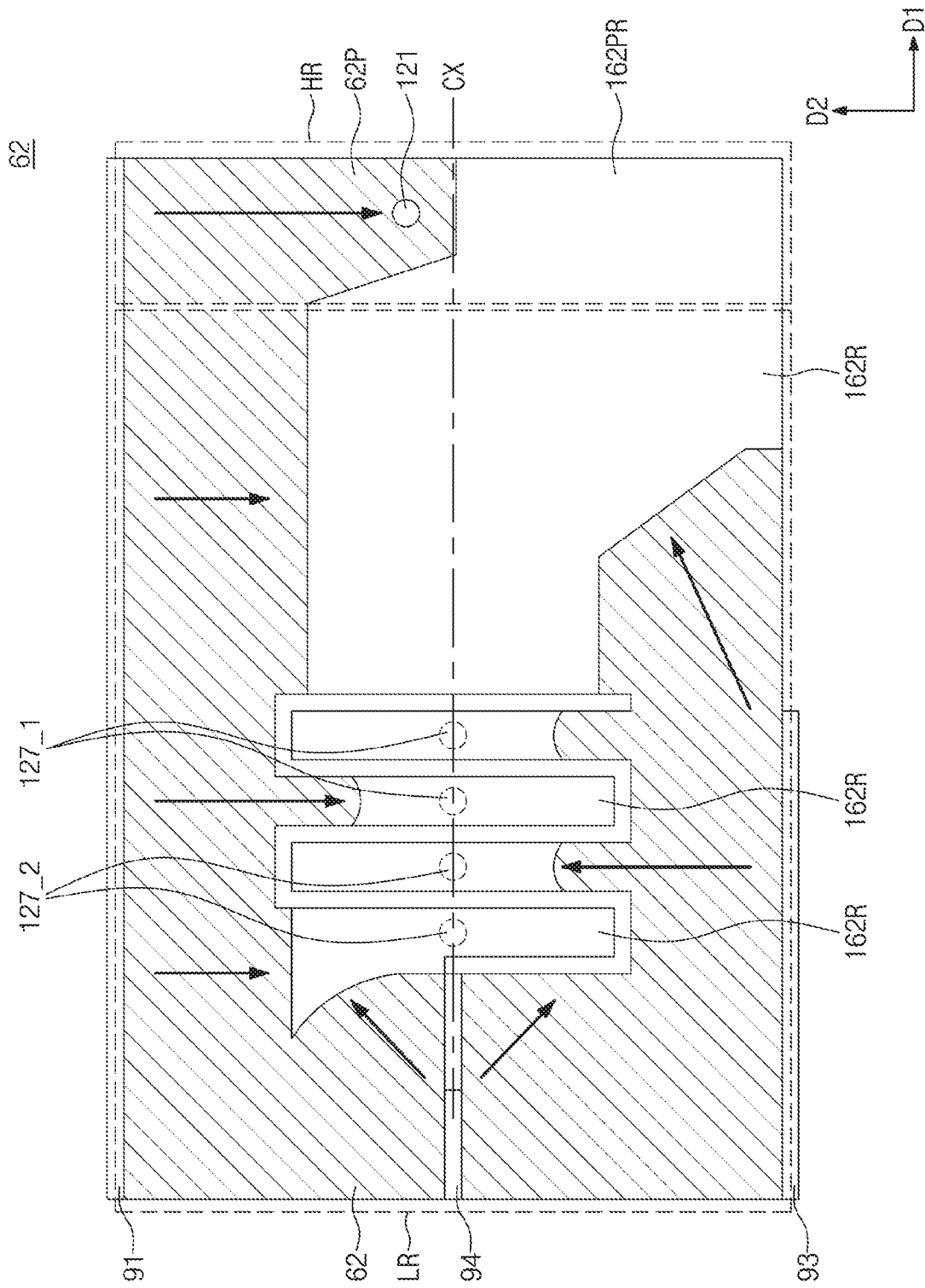

As illustrated in FIGS. 12 and 16, the horizontal isolation pattern 201 may penetrate the uppermost lower electrode layer 62. The uppermost lower electrode layer 62 may include a non-pad region LR disposed under the dummy electrode layer 68 disposed thereon, and a pad region HR exposed by the dummy electrode layer 68. The uppermost lower electrode layer 62 may include an uppermost lower pad 62P in its end portion (i.e., in the pad region HR).

Arrows in FIG. 16 indicate that an uppermost lower mold layer 162 is removed. In the non-pad region LR, an uppermost lower mold pattern 162R may remain at a relatively far distance from the isolation trenches 91, 93 and 94. In the pad region HR, the etchant provided from the first isolation trench 91 may remove the uppermost lower mold layer 162 to the extension line CX. An uppermost lower mold pad pattern 162PR may remain in the pad region HR. The uppermost lower pad 62P may be formed to fill a gap region formed in the pad region HR. The cell contact plug 121 may penetrate the uppermost lower pad 62P. In exemplary embodiments, the cell contact plug 121 may penetrate at least one mold pattern disposed under the uppermost lower pad 62P.

The first selection contact plugs 127_1 and the second selection contact plugs 127_2 may penetrate the uppermost lower mold pattern 162R. As a result, the first selection contact plugs 127_1 and the second selection contact plugs 127_2 may be electrically isolated from the uppermost lower electrode layer 62.

Figure 17:
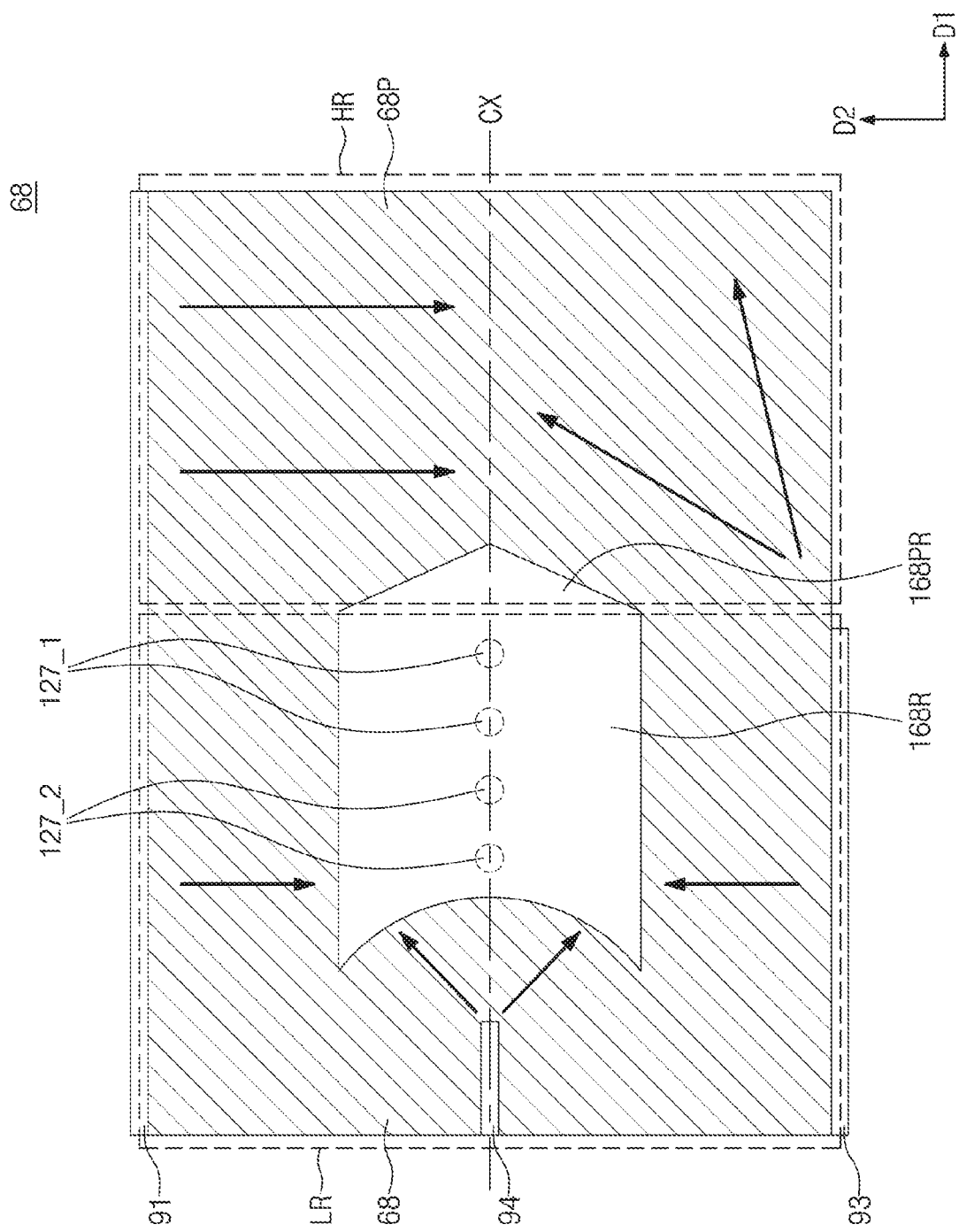
FIGS. 17 and 18 are plan views illustrating a dummy electrode layer and an uppermost lower electrode layer according to exemplary embodiments of the inventive concept.
Figure 18:
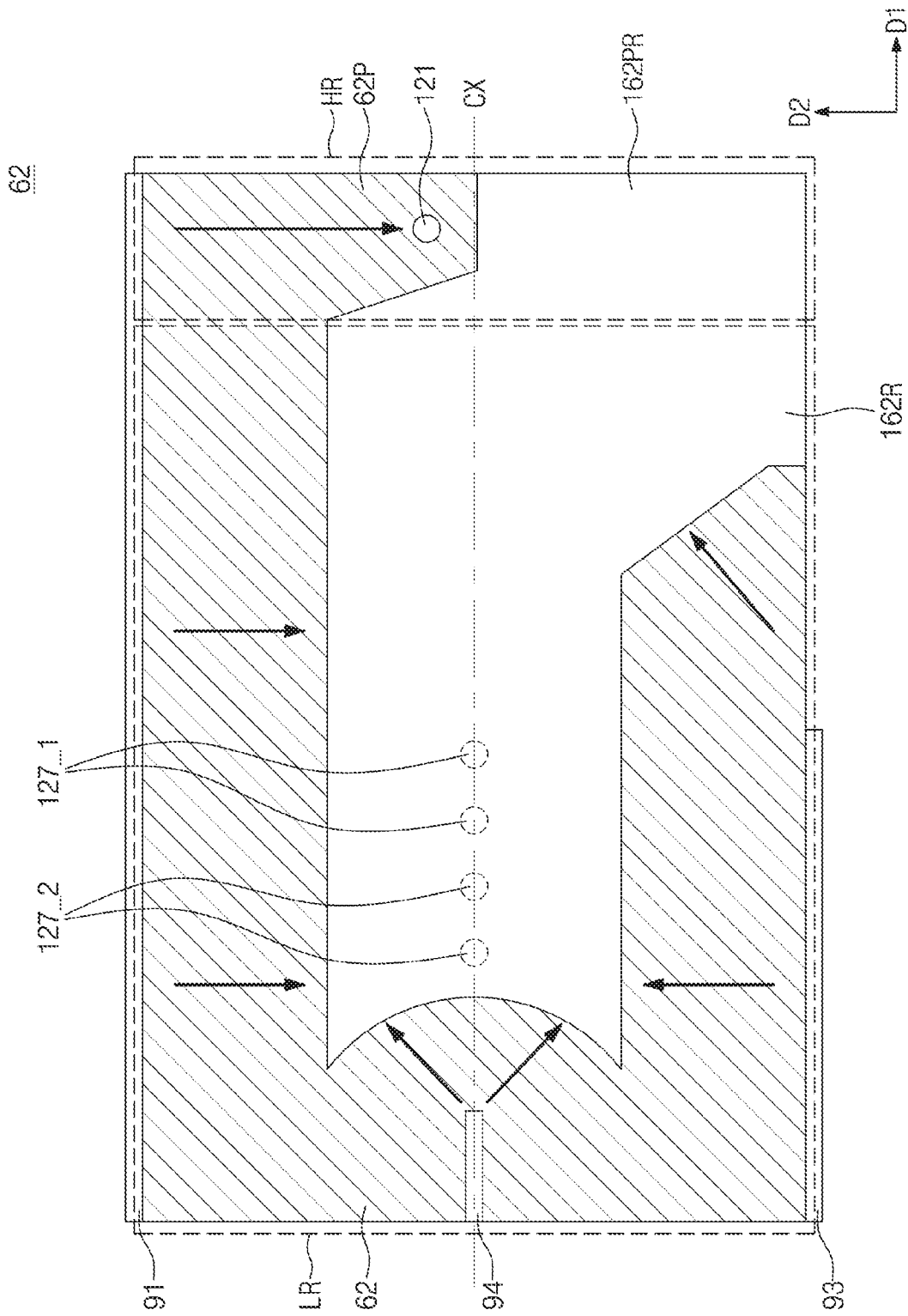

FIGS. 17 and 18 are plan views illustrating a dummy electrode layer 68 and an uppermost lower electrode layer 62 according to exemplary embodiments of the inventive concept.

In exemplary embodiments described hereinafter with reference to FIGS. 17 and 18, the horizontal isolation pattern 201 penetrates second and first upper electrode layers 72 and 71, but does not penetrate a dummy electrode layer 68 and electrode layers disposed under the dummy electrode layer 68. For example, a bottom surface of the horizontal isolation pattern 201 may be disposed at substantially the same level as a bottom surface of the first selection line isolation pattern 101, and may be disposed at a level between the first upper electrode layer 71 and the dummy electrode layer 68. In the exemplary embodiments described hereinafter with reference to FIGS. 17 and 18, the second upper electrode layer 72 and the first upper electrode layer 71 may be the same as illustrated in FIGS. 13 and 14, but the dummy electrode layer 68 and the uppermost lower electrode layer 62 may be different, as described below.

Referring to FIG. 17, in exemplary embodiments, the horizontal isolation pattern 201 does not penetrate the dummy electrode layer 68. In the non-pad region LR, a dummy mold pattern 168R may be formed at a relatively far distance from the isolation trenches 91, 93 and 94. In the pad region HR, the etchant provided from each of the isolation trenches 91 and 93 may remove the dummy mold layer 168 to the extension line CX, and a dummy pad 68P may be formed to fill a gap region formed by the removal of the dummy mold layer 168. A dummy mold pad pattern 168PR may be formed in the pad region HR.

Referring to FIG. 18, in exemplary embodiments, the horizontal isolation pattern 201 does not penetrate the uppermost lower electrode layer 62. In the non-pad region LR, an uppermost lower mold pattern 162R may be formed at a relatively far distance from the isolation trenches 91, 93 and 94. In the pad region HR, the etchant provided from the first isolation trench 91 may remove the uppermost lower mold layer 162 to the extension line CX. Thus, the uppermost lower pad 62P may be formed to fill a gap region formed in the pad region HR. An uppermost lower mold pad pattern 162PR may be formed in the pad region HR.

The cell contact plug 121 may penetrate the uppermost lower pad 62P. In exemplary embodiments, the cell contact plug 121 may also penetrate at least one mold pattern disposed under the uppermost lower pad 62P.

Figure 19:
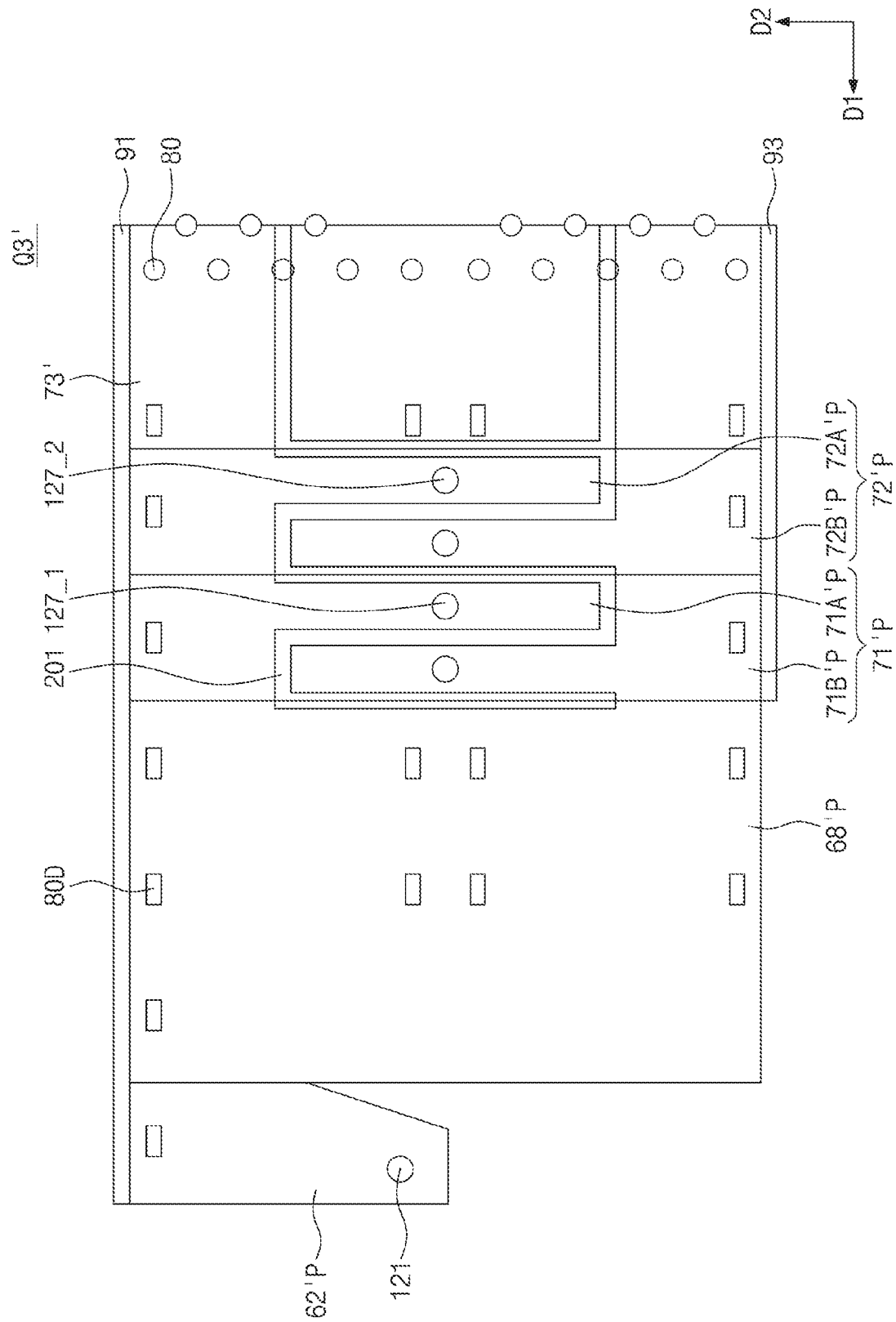
FIG. 19 is an enlarged view of region Q3', similar to region 'Q3' of FIG. 3, according to exemplary embodiments of the inventive concept.

FIG. 19 is an enlarged view of region Q3', similar to region Q3 of FIG. 3, according to exemplary embodiments of the inventive concept. FIGS. 20, 21, 22 and 23 are plan views illustrating a second upper electrode layer 72', a first upper electrode layer 71', a dummy electrode layer 68', and an uppermost lower electrode layer 62' according to exemplary embodiments of FIG. 19, respectively.

The region Q3 and the region Q3' may be connection regions which are disposed with one memory block interposed therebetween. For example, the region Q3 may correspond to a portion of the first connection region EX1_1 of FIG. 1, and the region Q3' may correspond to a portion of the second connection region EX2_1 of FIG. 1. For convenience of explanation, a further description of elements and technical aspects previously described may be omitted herein, and such elements and technical aspects may be substantially the same as corresponding elements and technical aspects previously described.

Referring to FIGS. 19 to 23, each of upper electrode layers 71',72' and 73' may be provided between the first isolation trench 91 and the third isolation trench 93, and may be divided into segments horizontally spaced apart from each other.

Figure 20:
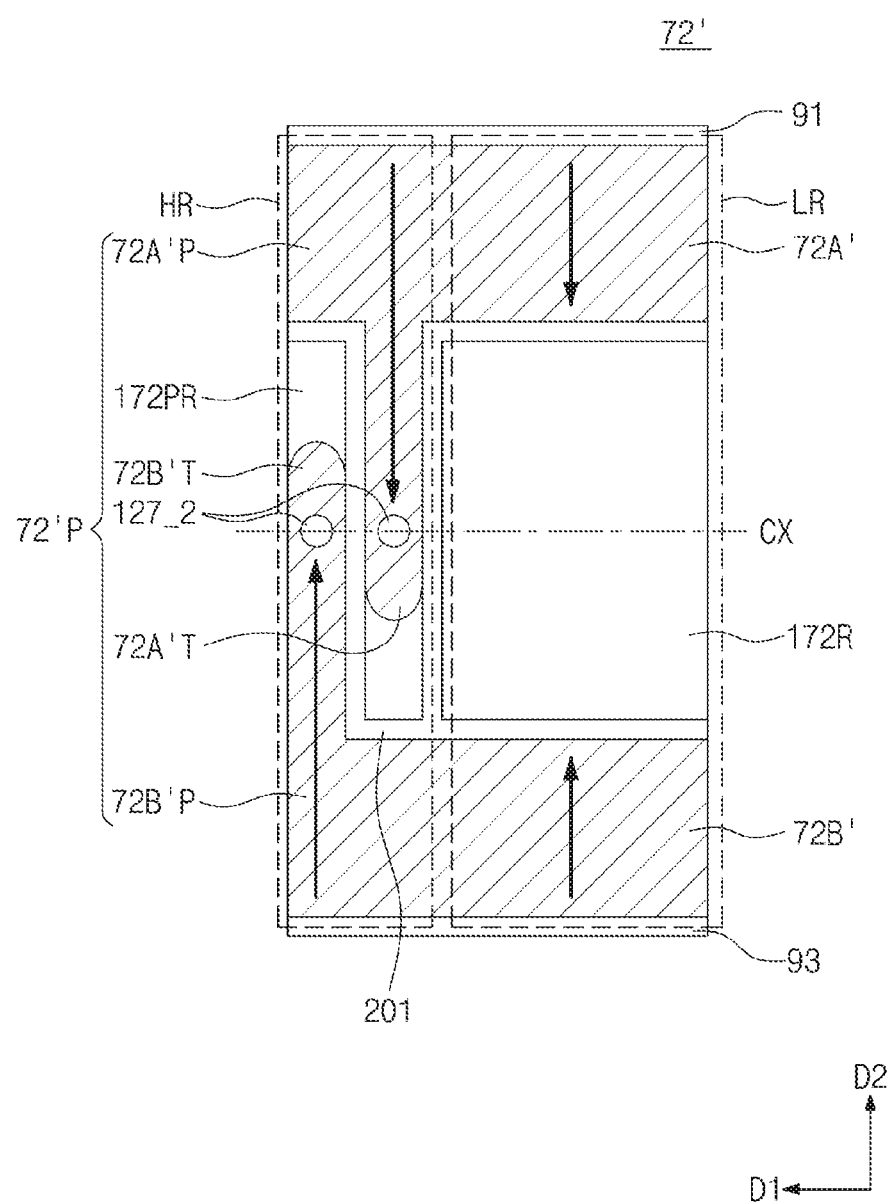
FIGS. 20, 21, 22 and 23 are plan views illustrating a second upper electrode layer, a first upper electrode layer, a dummy electrode layer, and an uppermost lower electrode layer according to exemplary embodiments of FIG. 19, respectively.

As illustrated in FIGS. 19 and 20, a second upper electrode layer 72' may include an upper electrode layer 72A' and an upper electrode layer 72B', which are separated or isolated from each other. Portions of the upper electrode layer 72A' and the upper electrode layer 72B' are also illustrated in FIG. 13.

The upper electrode layer 72A' and the upper electrode layer 72B' may be separated from each other by a horizontal isolation pattern 201. The upper electrode layer 72A' and the upper electrode layer 72B' may include an upper pad 72A'P and an upper pad 72B'P in end portions thereof (i.e., in a pad region HR), respectively. Due to a shape of the horizontal isolation pattern 201, the upper pad 72B'P may have a pad protrusion 72B'T protruding in the second direction D2, and the upper pad 72A'P may have a pad protrusion 72A'T protruding in the opposite direction to the second direction D2.

Movement of an etchant may be stopped by the horizontal isolation pattern 201, and thus, a second upper mold pattern 172R may be formed. The pad protrusions 72B'T and 72A'T may be formed to fill gap regions formed in the pad region HR. A second upper mold pad pattern 172PR may be formed in the pad region HR. Second selection contact plugs 127_2 may be connected to the pad protrusions 72A'T and 72B'T, respectively. The second selection contact plugs 127_2 may penetrate a first upper mold pattern 171R.

Figure 21:
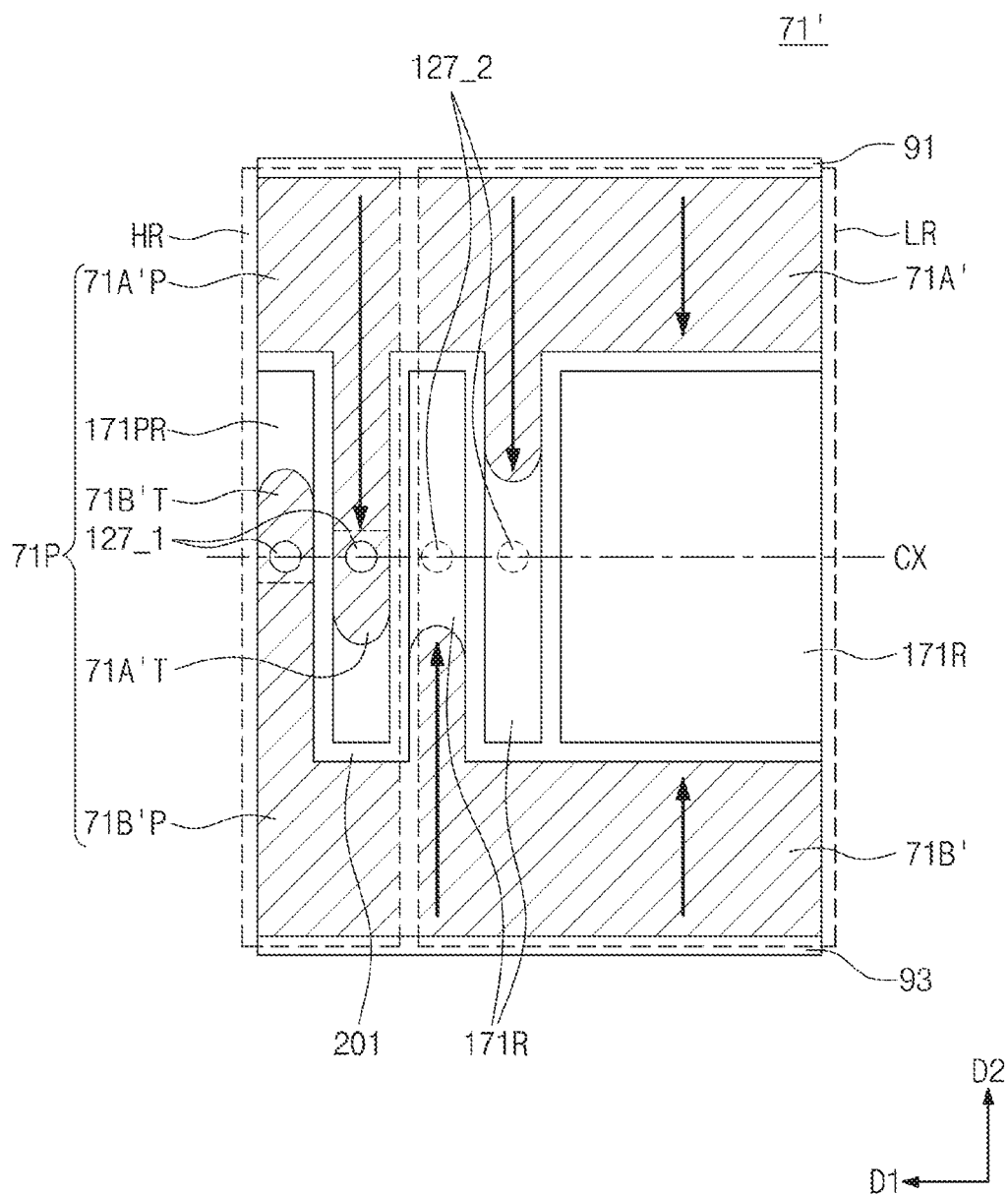

As illustrated in FIGS. 19 and 21, a first upper electrode layer 71' may include an upper electrode layer 71A' and an upper electrode layer 71B', which are separated or isolated from each other. The upper electrode layer 71A' and the upper electrode layer 71B' may include an upper pad 71A'P and an upper pad 71B'P in a pad region HR, respectively. The upper pad 71B'P may have a pad protrusion 71B'T protruding in the second direction D2, and the upper pad 71A'P may have a pad protrusion 71A'T protruding in the opposite direction to the second direction D2. Movement of the etchant may be stopped by the horizontal isolation pattern 201, and thus, a first upper mold pattern 171R may remain in a non-pad region LR. A first upper mold pad pattern 171PR may be formed in the pad region HR. The pad protrusions 71B'T and 71A'T may be formed to fill gap regions formed in the pad region HR.

First selection contact plugs 127_1 may be connected to the pad protrusions 71A'T and 71B'T, respectively. Each of the first selection contact plugs 127_1 may penetrate each of the pad protrusions 71A'T and 71B'T so as to be in contact with a dummy mold pattern 168R.

Figure 22:
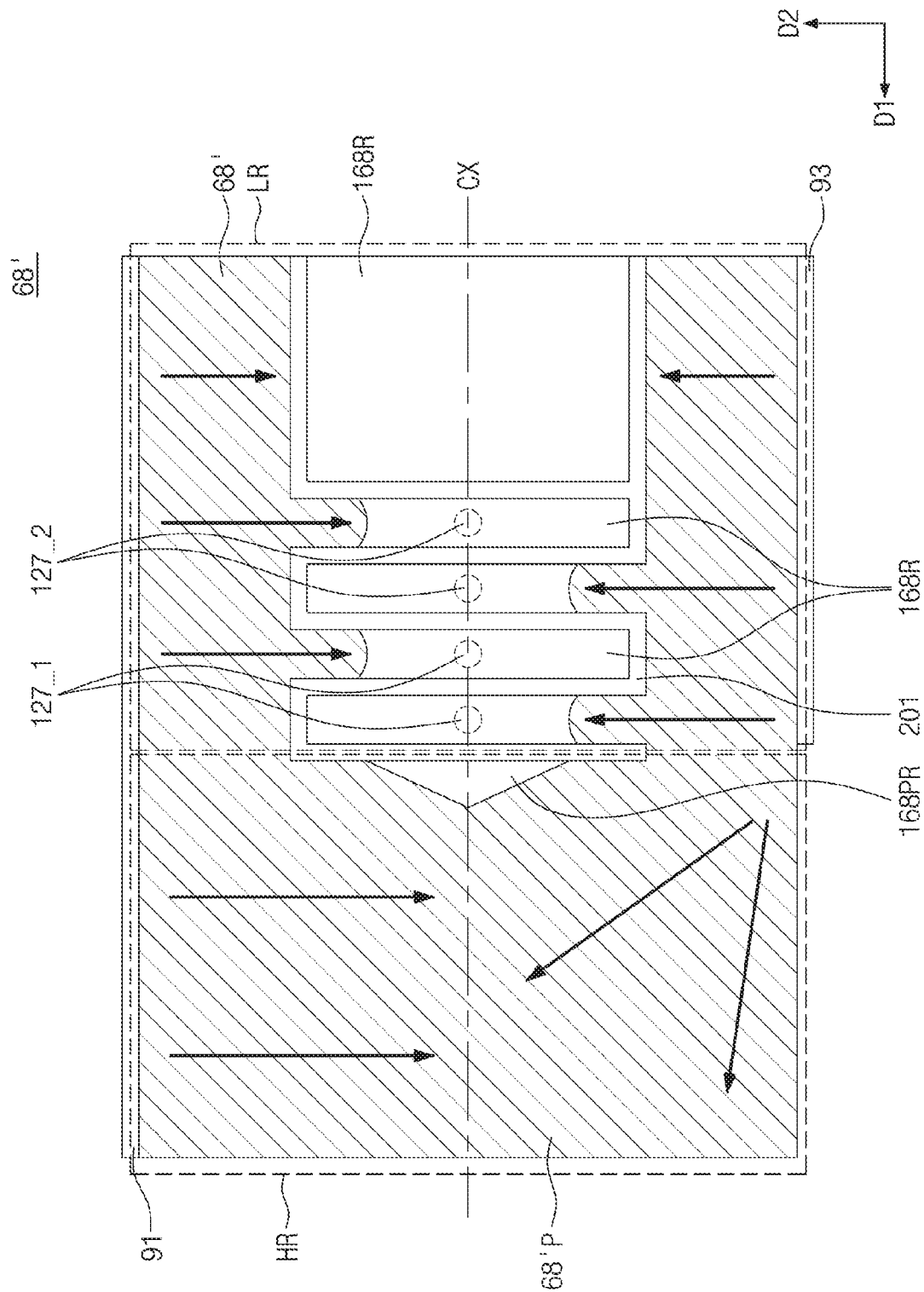

As illustrated in FIGS. 19 and 22, the horizontal isolation pattern 201 may penetrate the dummy electrode layer 68'. The dummy electrode layer 68' may be connected to the dummy electrode layer 68 of FIG. 15. The dummy electrode layer 68' may include a dummy pad 68'P in its end portion (i.e., in the pad region HR). A dummy mold pattern 168R may remain in the non-pad region LR by the first and second selection line isolation patterns 101 and 102 and the horizontal isolation pattern 201. In the pad region HR, the etchant provided from each of the isolation trenches 91 and 93 may remove the dummy mold layer 168 to the extension line CX. A dummy mold pad pattern 168PR may be formed in the pad region HR. The first selection contact plugs 127_1 and the second selection contact plugs 127_2 may penetrate the dummy mold pattern 168R.

Figure 23:
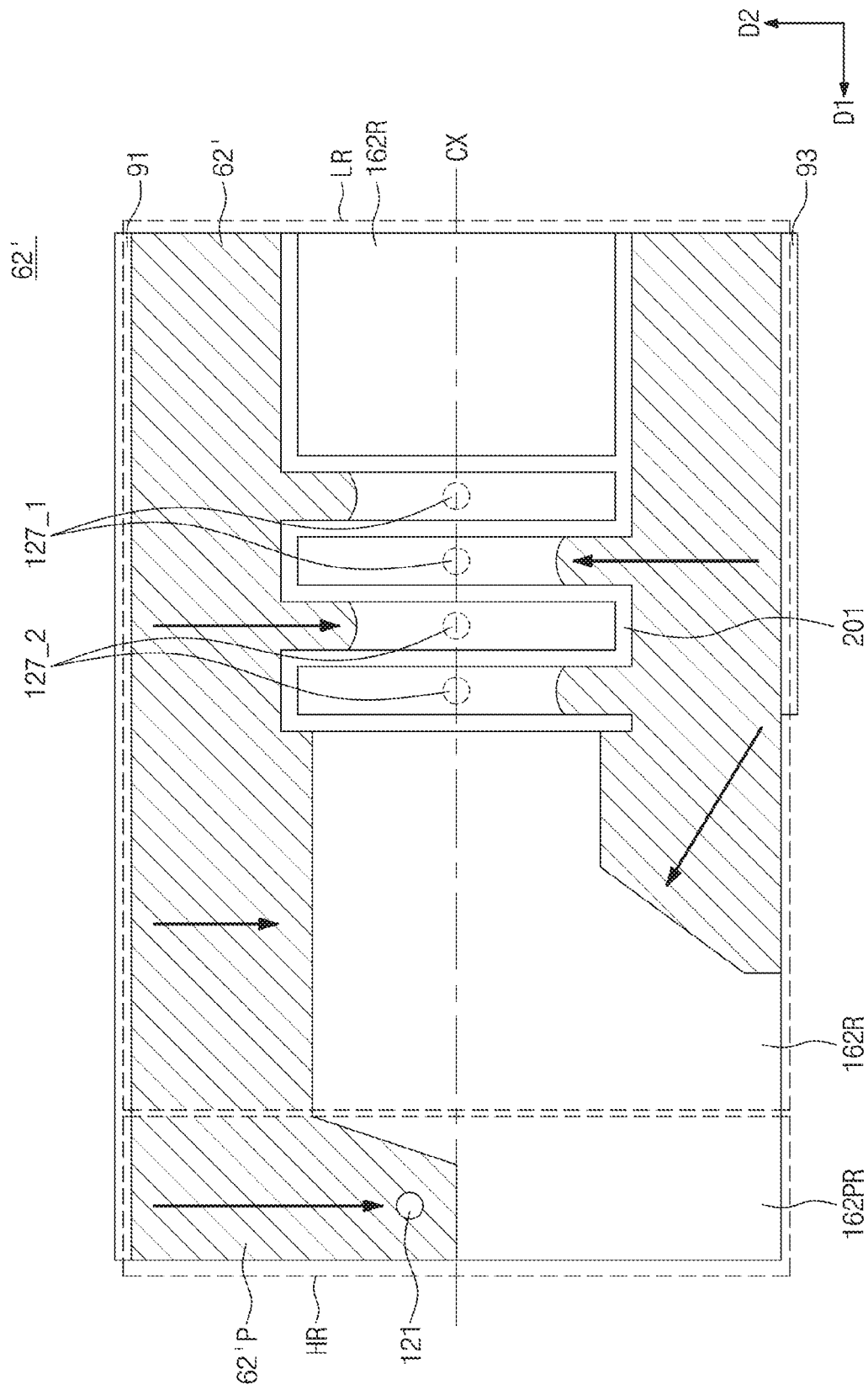

As illustrated in FIGS. 19 and 23, the horizontal isolation pattern 201 may penetrate the uppermost lower electrode layer 62'. The uppermost lower electrode layer 62' may include an uppermost lower pad 62'P in the pad region HR. An uppermost lower mold pattern 162R may remain in the non-pad region LR. In the pad region HR, the etchant provided from the first isolation trench 91 may remove the uppermost lower mold layer 162 to the extension line CX. Thus, the uppermost lower pad 62'P may be formed to fill a gap region formed in the pad region HR. An uppermost lower mold pad pattern 162PR may be formed in the pad region HR. The cell contact plug 121 may penetrate the uppermost lower pad 62'P. In exemplary embodiments, the cell contact plug 121 may penetrate at least one mold pattern disposed under the uppermost lower pad 62'P.

The first selection contact plugs 127_1 and the second selection contact plugs 127_2 may penetrate the uppermost lower mold pattern 162R. As a result, the first selection contact plugs 127_1 and the second selection contact plugs 127_2 may be electrically isolated from the uppermost lower electrode layer 62'.

Figure 24:
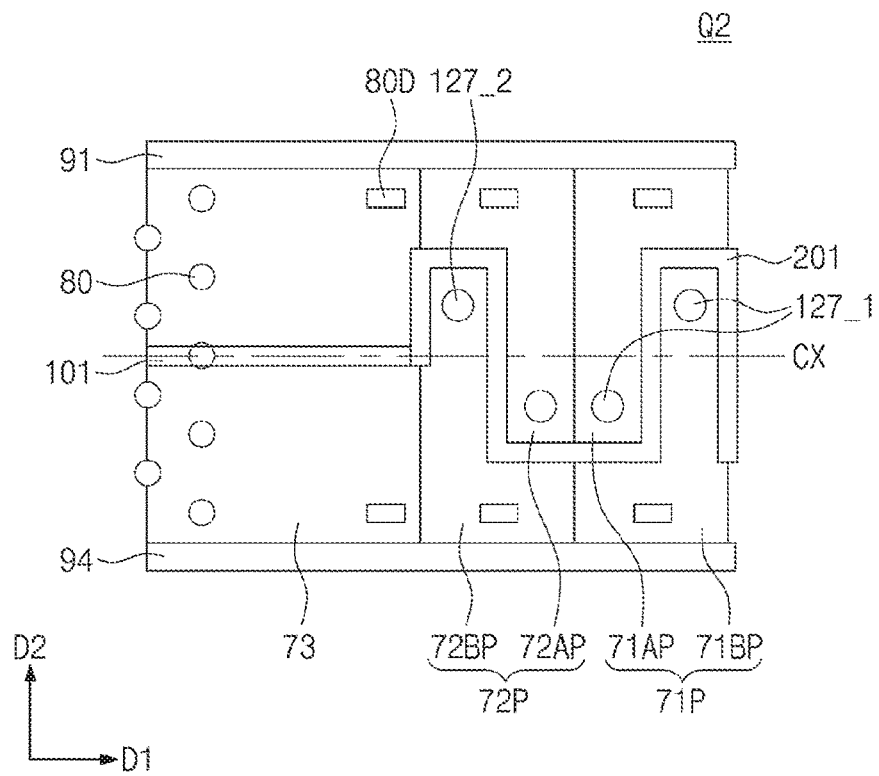
FIG. 24 is an enlarged view of region Q2 of FIG. 3 according to exemplary embodiments of the inventive concept.
Figure 25:
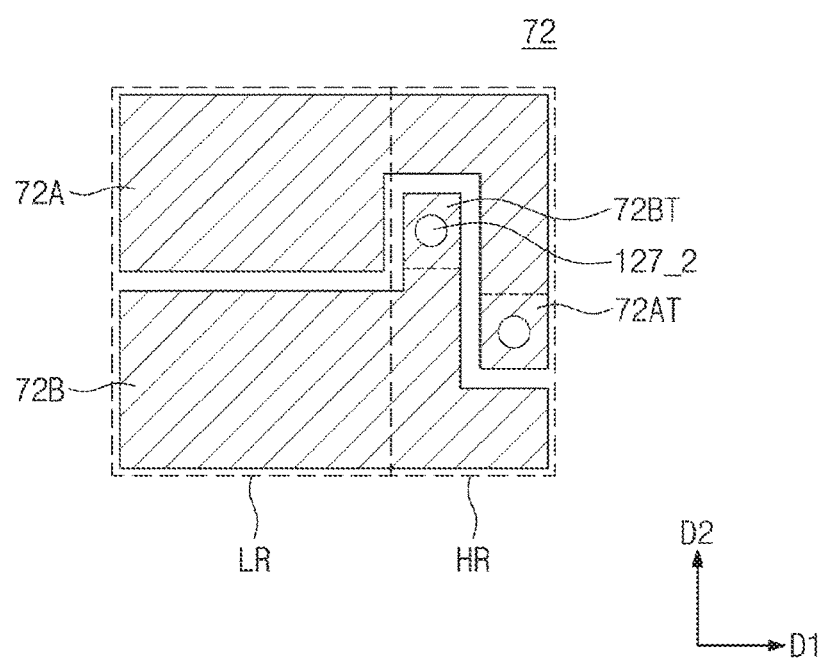
FIGS. 25 and 26 are plan views illustrating a second upper electrode layer and a first upper electrode layer according to exemplary embodiments of FIG. 24, respectively.
Figure 26:
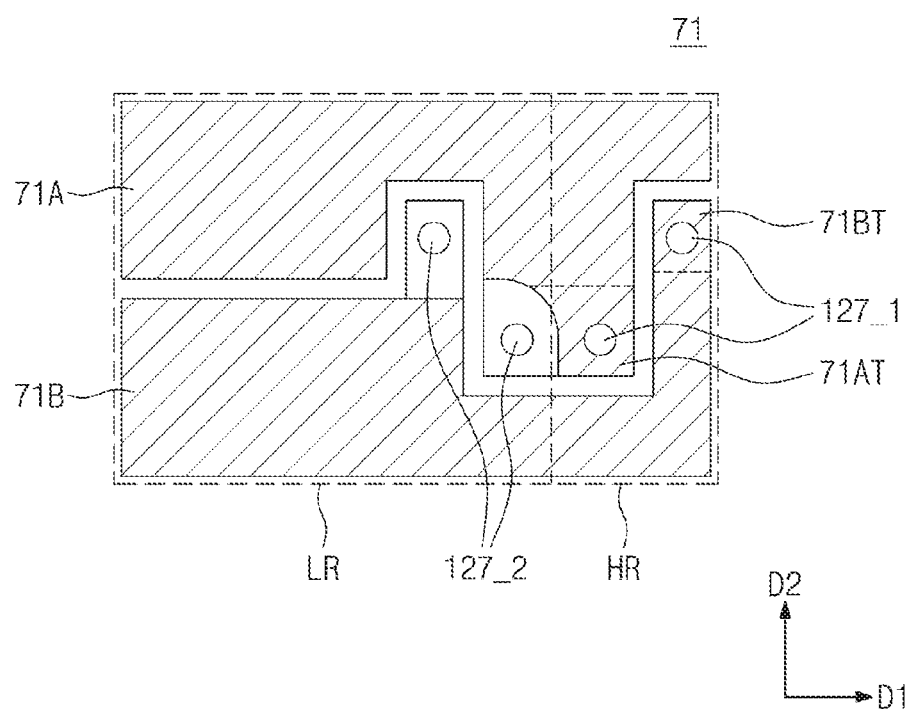

FIG. 24 is an enlarged view of region Q2 of FIG. 3 according to exemplary embodiments of the inventive concept. FIGS. 25 and 26 are plan views illustrating a second upper electrode layer 72 and a first upper electrode layer 71 according to exemplary embodiments of FIG. 24, respectively.

Referring to FIGS. 24 to 26, in exemplary embodiments, a shape of a horizontal isolation pattern 201 may be different from the shape in the exemplary embodiment of FIG. 7. Thus, the arrangement and shapes of pad protrusions may be changed. For example, a pad protrusion 72AT of an upper pad 72AP may be adjacent to a pad protrusion 71AT of an upper pad 71AP in the first direction D1.

Figure 27:
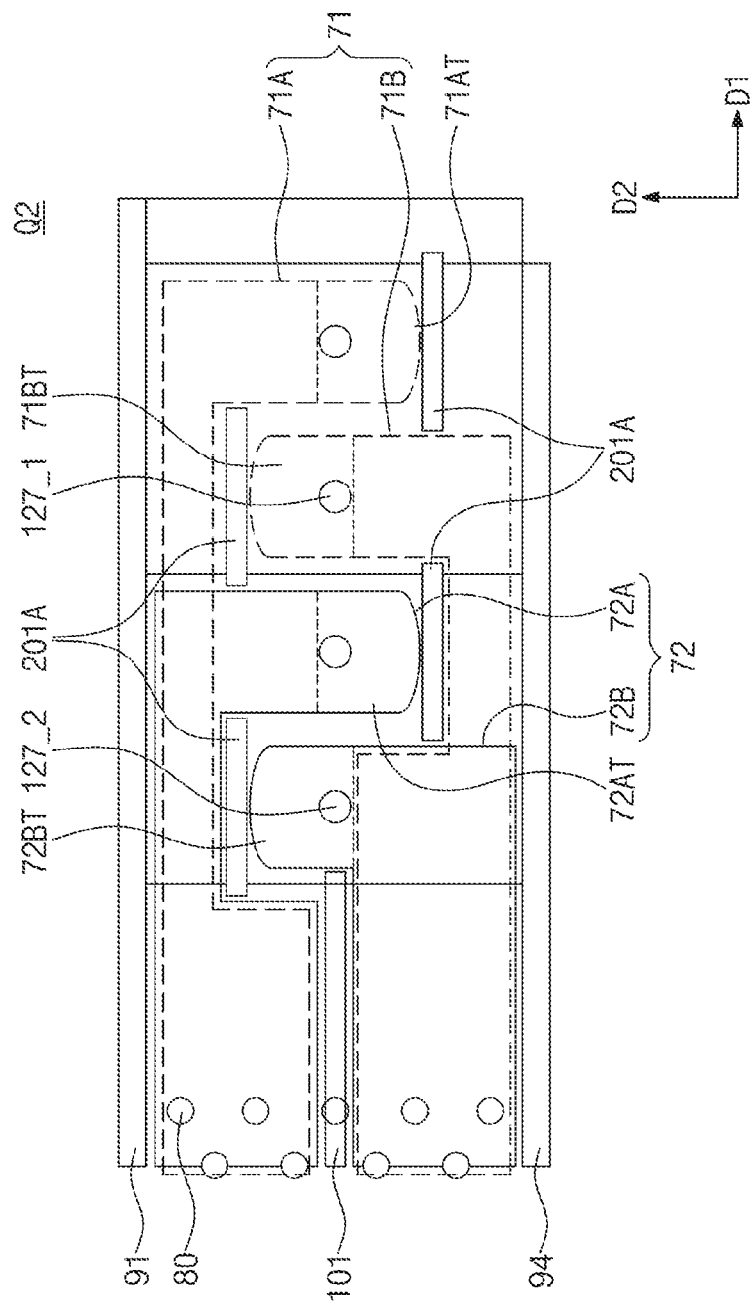
FIG. 27 is an enlarged view of region Q2 of FIG. 3 according to exemplary embodiments of the inventive concept.

FIG. 27 is an enlarged view of region Q2 of FIG. 3 according to exemplary embodiments of the inventive concept.

Referring to FIG. 7, in exemplary embodiments, a horizontal isolation pattern includes horizontal isolation portions 201A but does not include vertical isolation portions 201B, unlike the exemplary embodiment of FIG. 7. The horizontal isolation portions 201A may be arranged in a zigzag pattern along an extension line of a selection line isolation pattern 101. In exemplary embodiments, the horizontal isolation portions 201A may be arranged in a zigzag pattern with an extension line of a middle isolation trench interposed therebetween. End portions of the horizontal isolation portions 201A disposed adjacent to each other may overlap with each other in the second direction D2.

Figure 28:
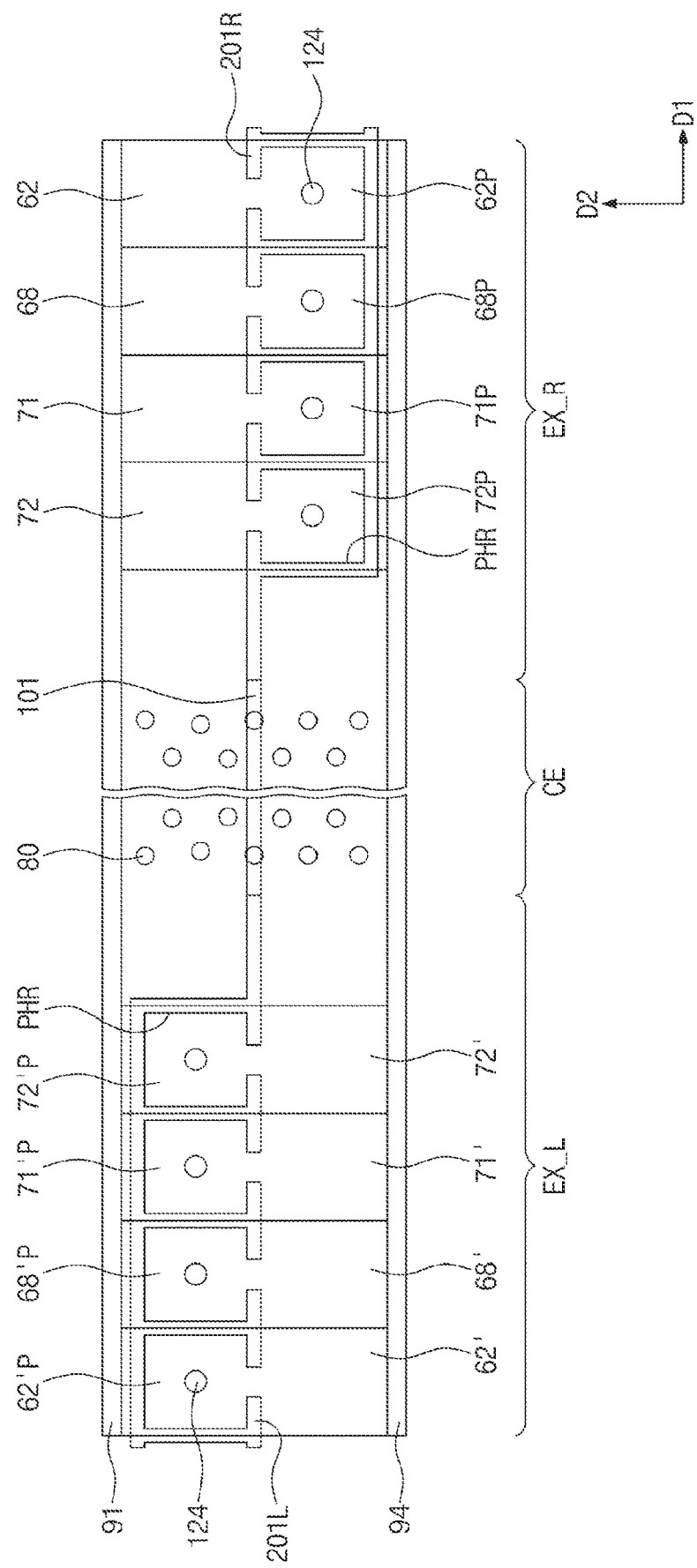
FIG. 28 is a plan view illustrating a cell array region and first and second connection regions according to exemplary embodiments of the inventive concept.
Figure 29:
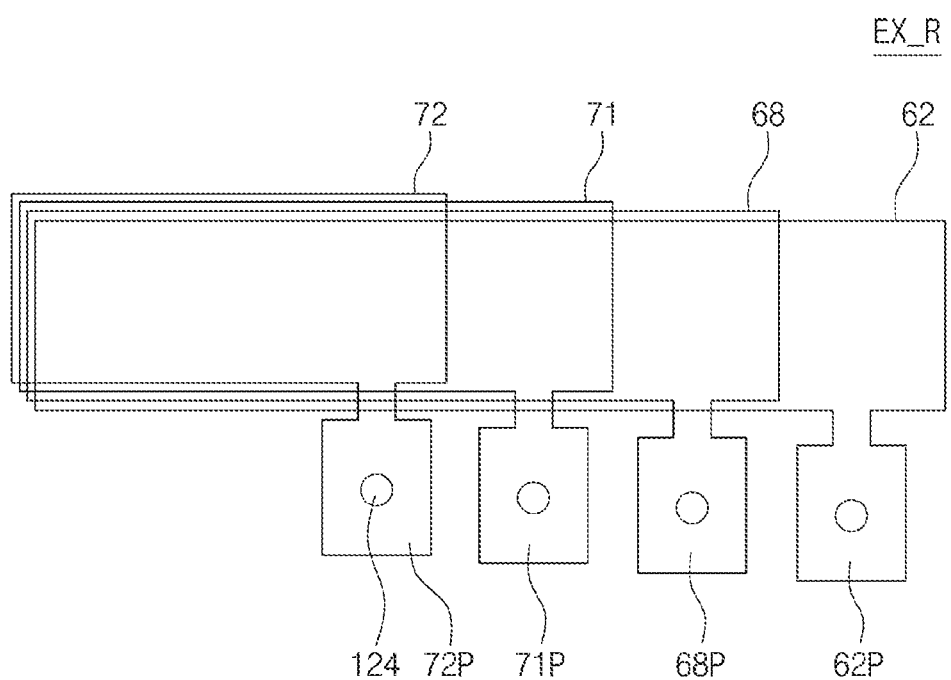
FIG. 29 is a plan view illustrating a second upper electrode layer, a first upper electrode layer, a dummy electrode layer and an uppermost lower electrode layer disposed in the first connection region of FIG. 28.

FIG. 28 is a plan view illustrating a cell array region CE and first and second connection regions EX_R and EX_L according to exemplary embodiments of the inventive concept. FIG. 29 is a plan view illustrating a second upper electrode layer 72, a first upper electrode layer 71, a dummy electrode layer 68 and an uppermost lower electrode layer 62 disposed in the first connection region EX_R of FIG. 28.

Pads of a second upper electrode layer 72, a first upper electrode layer 71, a first dummy electrode layer 68 and a first uppermost lower electrode layer 62 may be disposed in a first connection region EX_R. For example, a second upper pad 72P, a first upper pad 71P, a first dummy pad 68P and a first uppermost lower pad 62P may be disposed in the first connection region EX_R. Pads of a second upper electrode layer 72', a first upper electrode layer 71', a second dummy electrode layer 68' and a second uppermost lower electrode layer 62' may be disposed in a second connection region EX_L. For example, a second upper pad 72'P, a first upper pad 71'P, a second dummy pad 68'P and a second uppermost lower pad 62'P may be disposed in the second connection region EX_L. The pads disposed in the first connection region EX_R may be adjacent to a first isolation trench 91, and the pads disposed in the second connection region EX_L may be adjacent to a fourth isolation trench 94. A contact plug 124 may be connected to each of the pads. The contact plug 124 may penetrate each of the pads and may also penetrate at least one of mold patterns disposed thereunder.

The pads in the first connection region EX_R may be formed by a first horizontal isolation pattern 201R, and the pads in the second connection region EX_L may be formed by a second horizontal isolation pattern 201L. Each of the first and second horizontal isolation patterns 201R and 201L may include pad formation regions PHR capable of defining shapes of the pads. The pad formation regions PHR may be arranged in the first direction D1.

Figure 30:
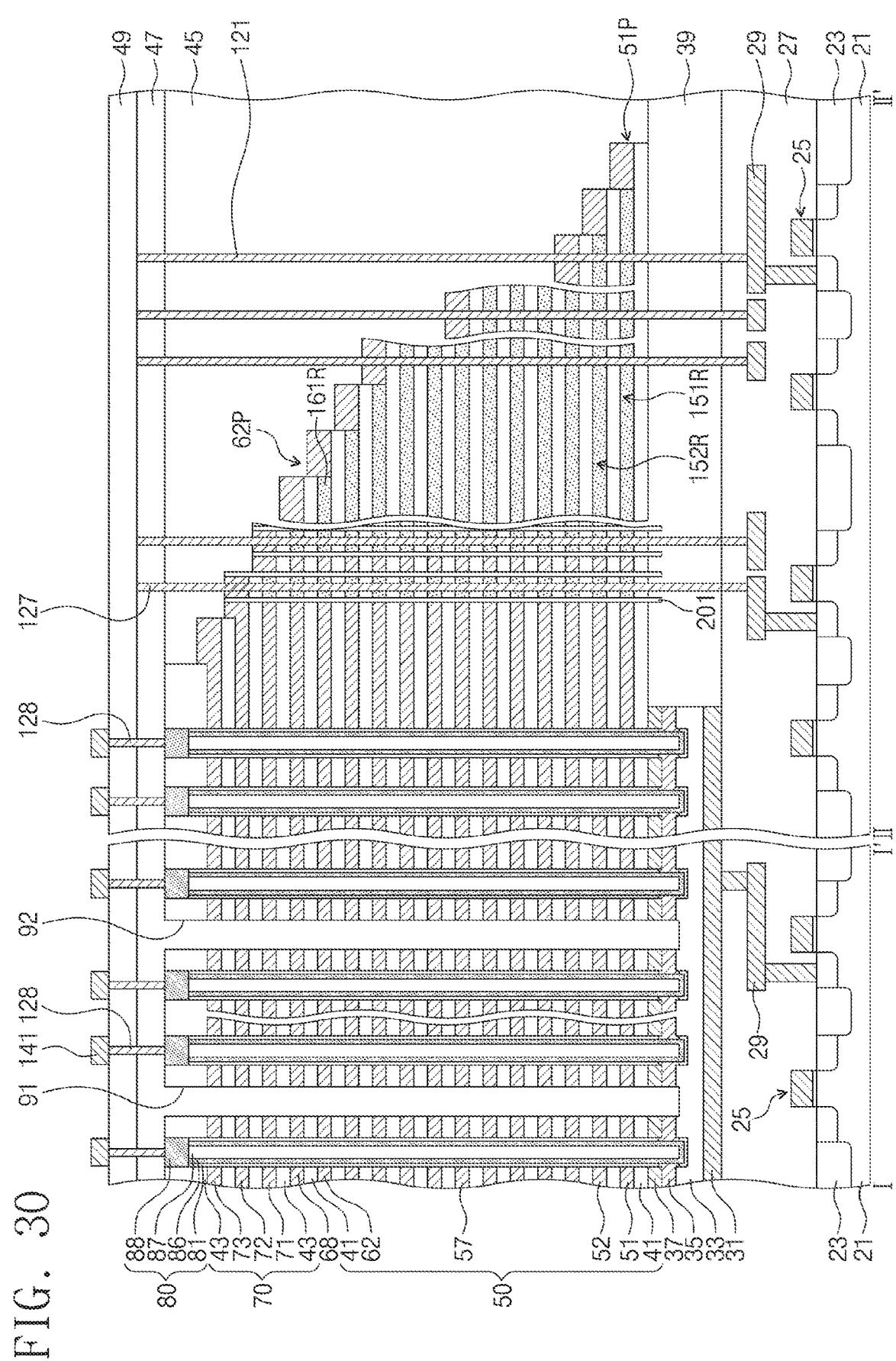
FIG. 30 is a cross-sectional view taken along lines I-I' and II-II' of FIG. 3, and illustrate a cell array region and a connection region according to exemplary embodiments of the inventive concept.

FIG. 30 is a cross-sectional view taken along lines I-I' and II-IF of FIG. 3, and illustrate a cell array region and a connection region according to exemplary embodiments of the inventive concept.

In the exemplary embodiment described below, at least one of a plurality of cell contact plugs 121 may penetrate a corresponding one of a plurality of lower pads 51P to 62P and may penetrate lower mold pattern(s) (at least one of 151R to 161R) disposed under the corresponding lower pad, so as to be connected to a corresponding one of a plurality of peripheral circuit interconnection lines 29. At least one of a plurality of selection contact plugs 127 may penetrate the lower mold patterns 151R to 161R disposed thereunder so as to be connected to a corresponding one of the plurality of peripheral circuit interconnection lines 29.

FIGS. 31, 33, 35, 37 and 39 are cross-sectional views taken along lines I-I' and II-II' of FIG. 3, and illustrate methods of manufacturing a 3D semiconductor memory device according to exemplary embodiments of the inventive concept. FIGS. 32, 34, 36, 38 and 40 are cross-sectional views taken along line III-III' of FIG. 3.

Figure 31:
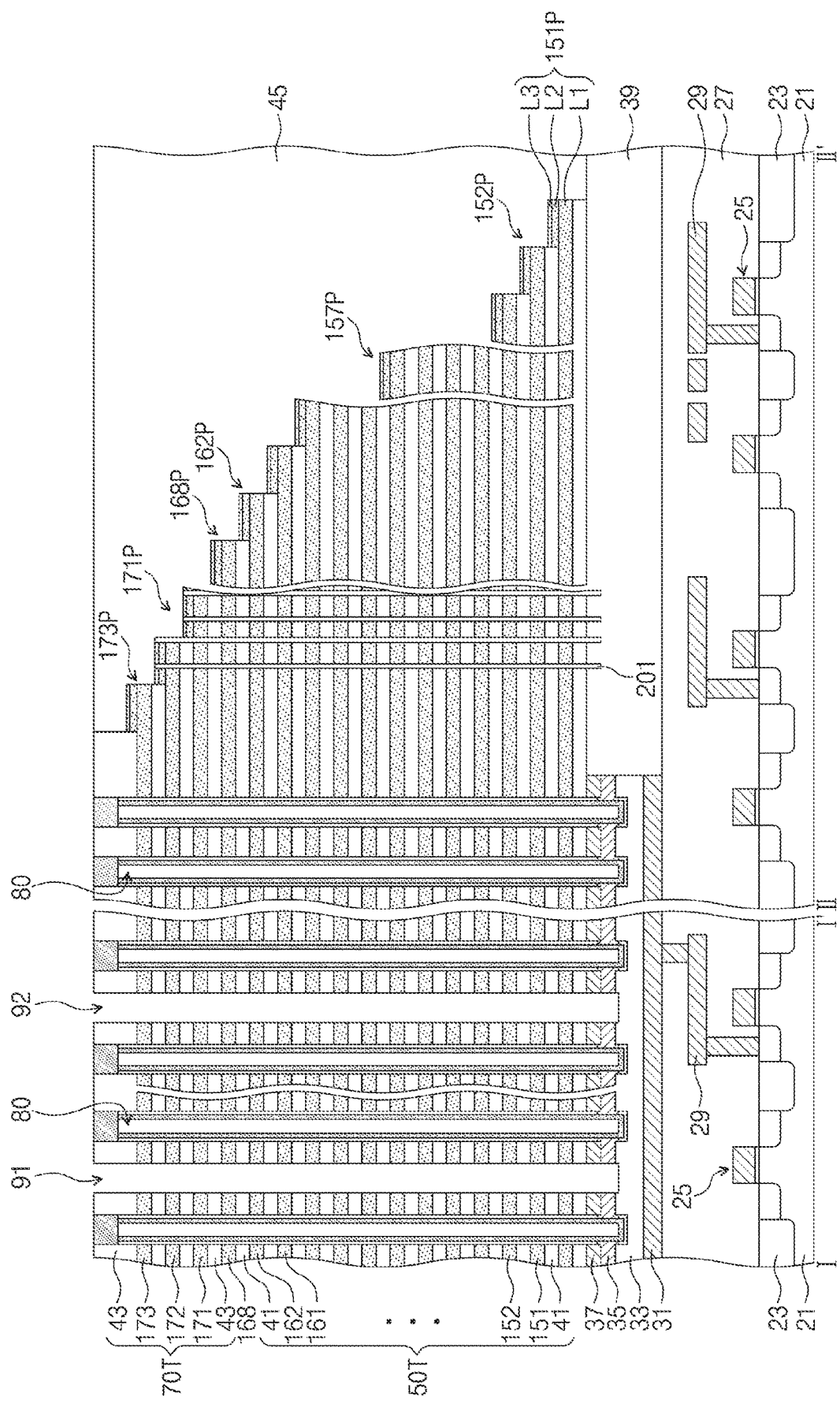
FIGS. 31, 33, 35, 37 and 39 are cross-sectional views taken along lines I-I' and II-II' of FIG. 3, and illustrate methods of manufacturing a 3D semiconductor memory device according to exemplary embodiments of the inventive concept.
Figure 32:
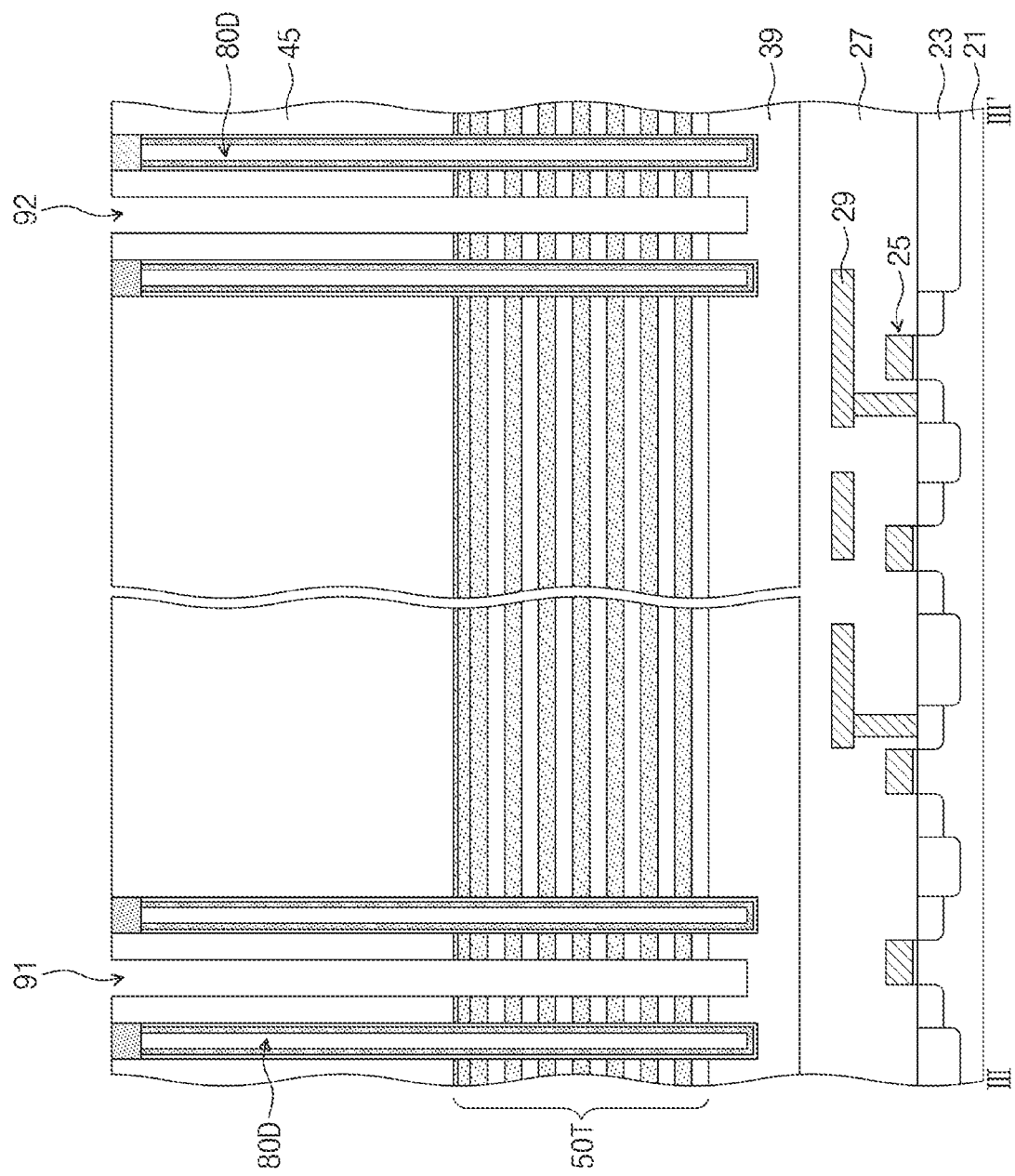
FIGS. 32, 34, 36, 38 and 40 are cross-sectional views taken along line III-III' of FIG. 3.

Referring to FIGS. 3, 31 and 32, a device isolation layer 23, a plurality of transistors 25, a lower interlayer insulating layer 27, a plurality of peripheral circuit interconnection lines 29, a lower buried conductive layer 31, a middle buried conductive layer 33, a replacement conductive line 35, a support plate 37, and a middle interlayer insulating layer 39 may be formed on a substrate 21. Top surfaces of the support plate 37 and the middle interlayer insulating layer 39 may be substantially coplanar with each other. For example, top surfaces of the support plate 37 and the middle interlayer insulating layer 39 may be substantially aligned with each other.

A preliminary lower stack structure 50T, a dummy mold layer 168, and a preliminary upper stack structure 70T may be sequentially stacked on the support plate 37 and the middle interlayer insulating layer 39. The preliminary lower stack structure 50T may include a plurality of lower insulating layers 41 and a plurality of lower mold layers 151 to 162, which are alternately and repeatedly stacked. The plurality of lower mold layers 151 to 162 may include at least lower mold layers 151, 152, 161 and 162. The preliminary upper stack structure 70T may include a plurality of upper insulating layers 43 and a plurality of upper mold layers 171, 172 and 173, which are alternately and repeatedly stacked.

A plurality of selection line isolation patterns 101 to 104 may be formed to penetrate the preliminary upper stack structure 70T. The plurality of selection line isolation patterns 101 to 104 may include an insulating material such as, for example, silicon oxide. A horizontal isolation pattern 201 may be formed to penetrate the preliminary upper stack structure 70T. The horizontal isolation pattern 201 may penetrate the preliminary lower stack structure 50T. In exemplary embodiments, a lower portion of the horizontal isolation pattern 201 may be inserted in the middle interlayer insulating layer 39. In this case, the horizontal isolation pattern 201 may be formed by a process different from a process of forming the selection line isolation patterns 101 to 104. Unlike FIG. 31, in exemplary embodiments, the horizontal isolation pattern 201 does not penetrate the preliminary lower stack structure 50T. For example, a bottom surface of the horizontal isolation pattern 201 may be disposed at substantially the same level as bottom surfaces of the selection line isolation patterns 101 to 104. In this case, the horizontal isolation pattern 201 may be formed simultaneously with the selection line isolation patterns 101 to 104.

A plurality of etching processes may be performed to form preliminary pads having a stair structure in a connection region EX. A plurality of preliminary pads 151P to 162P (including preliminary pads 152P and 157P), 168P, and 171P to 173P may be formed at end portions of the plurality of lower mold layers 151 to 162, the dummy mold layer 168, and the plurality of upper mold layers 171, 172 and 173. Etch rates of the plurality of preliminary pads 151P to 162P, 168P, and 171P to 173P may be higher than those of the plurality of lower mold layers 151 to 162, the dummy mold layer 168, and the plurality of upper mold layers 171, 172 and 173.

For example, a first preliminary pad 151P may be formed at an end portion of a first lower mold layer 151. The first preliminary pad 151P may include a first layer L1, a second layer L2 and a third layer L3, which are sequentially stacked. The first layer L1 may include substantially the same material as the first lower mold layer 151. A thickness of the first layer L1 may be substantially equal to that of the first lower mold layer 151. An etch rate of the second layer L2 may be higher than that of the first layer L1. An etch rate of the third layer L3 may be lower than that of the first layer L1. Alternatively, the third layer L3 may be omitted. The first preliminary pad 151P may be thicker than the first lower mold layer 151. Each of the plurality of preliminary pads 151P to 162P, 168P, and 171P to 173P may have substantially the same structure and/or components as the first preliminary pad 151P.

In exemplary embodiments, the first preliminary pad 151P may be formed by performing an ion implantation process and/or a plasma treatment process on an end portion of the first lower mold layer 151. In this case, a thickness of the first preliminary pad 151P may be substantially equal to that of the first lower mold layer 151.

An upper interlayer insulating layer 45 may be formed on the plurality of preliminary pads 151P to 162P, 168P, and 171P to 173P. A plurality of channel structures 80 may be formed to penetrate the preliminary upper stack structure 70T, the dummy mold layer 168, the preliminary lower stack structure 50T, the support plate 37, and the replacement conductive line 35. Bottom ends of the plurality of channel structures 80 may be inserted in the middle buried conductive layer 33. In exemplary embodiments, the formation of the plurality of channel structures 80 may be performed before the formation of the replacement conductive line 35. The replacement conductive line 35 may penetrate a data storage pattern of the channel structure 80 so as to be in contact with a sidewall of a channel pattern of the channel structure 80.

A plurality of support structures 80D may be formed during the formation of the plurality of channel structures 80. Each of the plurality of support structures 80D may have similar components (or a similar structure) to those of each of the plurality of channel structures 80. In exemplary embodiments, each of the plurality of support structures 80D may be formed of an insulating material (e.g., silicon oxide), unlike the channel structures 80.

First to fifth isolation trenches 91 to 95 may be formed to penetrate the preliminary upper stack structure 70T, the dummy mold layer 168, and the preliminary lower stack structure 50T. The plurality of lower mold layers 151 to 162, the dummy mold layer 168, the plurality of upper mold layers 171, 172 and 173, and the plurality of preliminary pads 151P to 162P, 168P, and 171P to 173P may be exposed at sidewalls of the first to fifth isolation trenches 91 to 95.

The substrate 21 may include a semiconductor substrate such as, for example, a silicon wafer. The device isolation layer 23 may include, for example, silicon oxide, silicon nitride, silicon oxynitride, or any combination thereof. Each of the lower, middle and upper interlayer insulating layers 27, 39 and 45 may include, for example, silicon oxide, silicon nitride, silicon oxynitride, low-k dielectrics, or any combination thereof. In exemplary embodiments, the middle interlayer insulating layer 39 may include, for example, at least one silicon nitride layer disposed between a plurality of silicon oxide layers.

The lower buried conductive layer 31 may be electrically connected to the peripheral circuit interconnection lines 29. The lower buried conductive layer 31 may include, for example, a metal, a metal nitride, a metal oxide, a metal silicide, poly-silicon, conductive carbon, or any combination thereof. The middle buried conductive layer 33 may include a semiconductor material such as, for example, poly-silicon doped with N-type dopants. The replacement conductive line 35 may include, for example, a metal, a metal nitride, a metal oxide, a metal silicide, poly-silicon, conductive carbon, or any combination thereof. In exemplary embodiments, the replacement conductive line 35 may include a semiconductor material such as, for example, poly-silicon doped with N-type dopants. The support plate 37 may include a semiconductor material such as, for example, poly-silicon.

The plurality of lower mold layers 151 to 162, the dummy mold layer 168 and the plurality of upper mold layers 171 to 173 may include a different material from that of the plurality of lower insulating layers 41 and the plurality of upper insulating layers 43. The plurality of lower mold layers 151 to 162, the dummy mold layer 168 and the plurality of upper mold layers 171 to 173 may include a material having an etch selectivity with respect to the plurality of lower insulating layers 41 and the plurality of upper insulating layers 43. For example, each of the plurality of lower mold layers 151 to 162, the dummy mold layer 168 and the plurality of upper mold layers 171 to 173 may include silicon nitride, and each of the plurality of lower insulating layers 41 and the plurality of upper insulating layers 43 may include silicon oxide.

Figure 33:
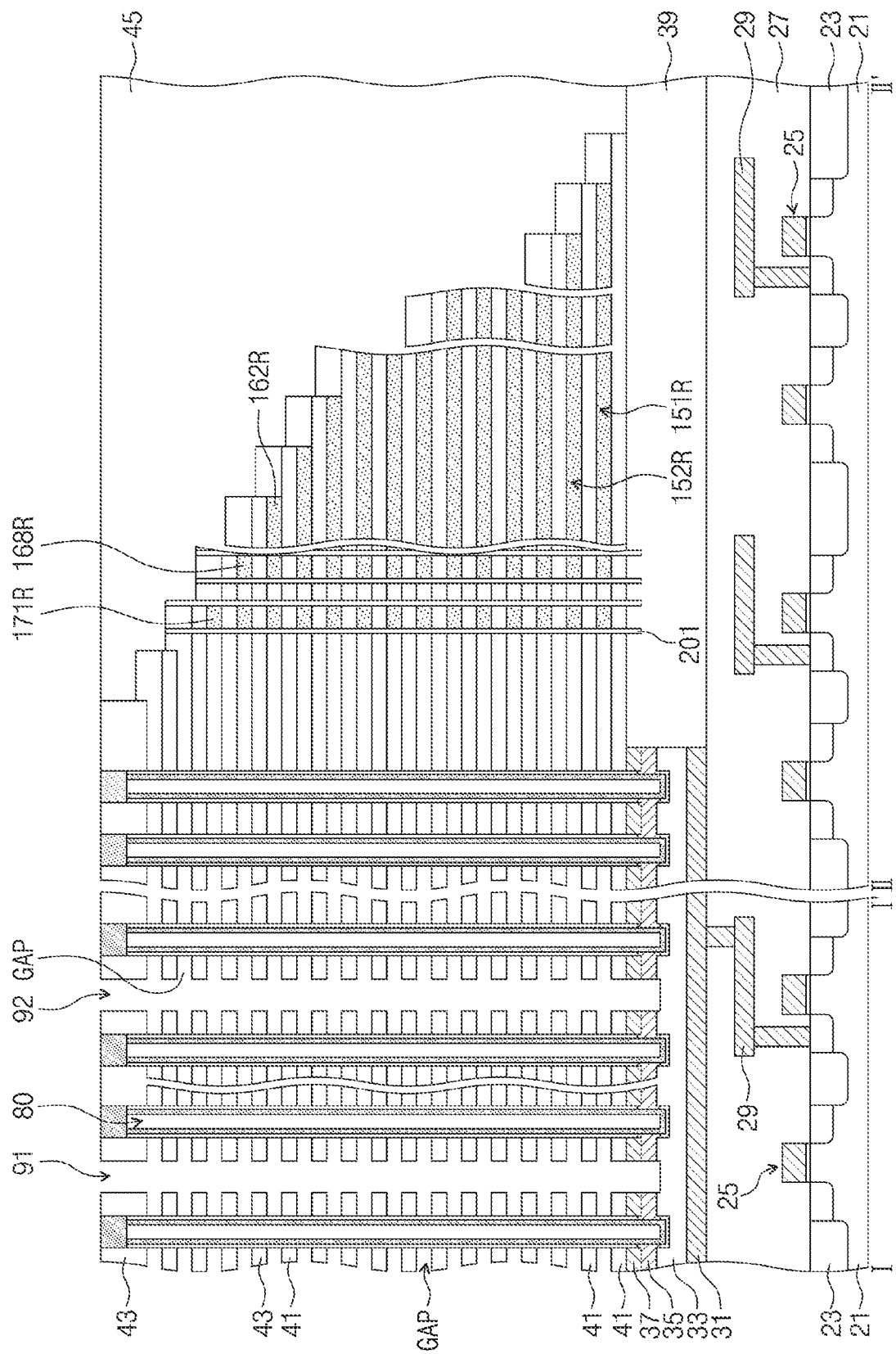
Figure 34:
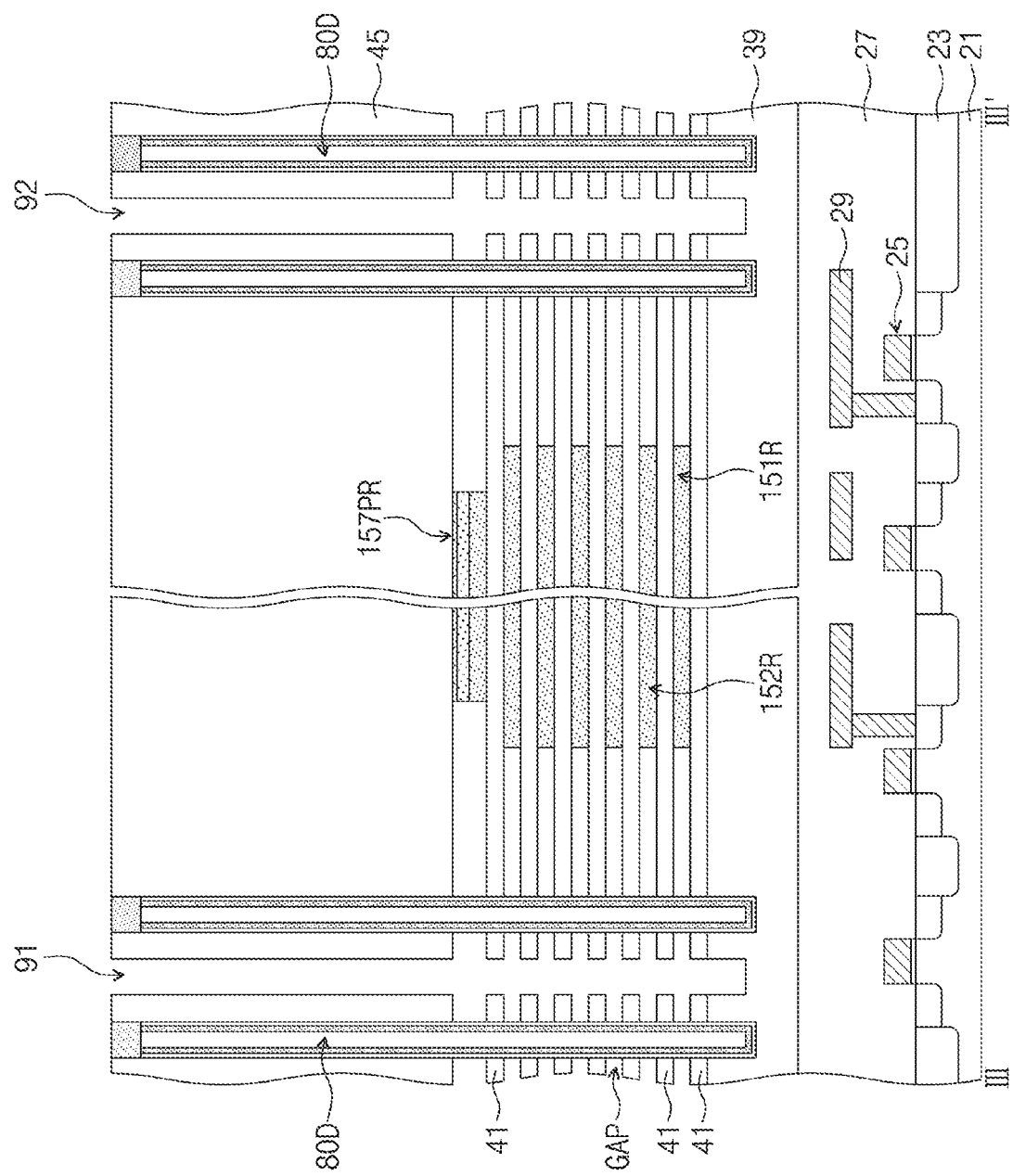

Referring to FIGS. 3, 33 and 34, an isotropic etching process may be performed to partially remove the plurality of lower mold layers 151 to 162, the dummy mold layer 168, the plurality of upper mold layers 171 to 173, and the plurality of preliminary pads 151P to 162P, 168P, and 171P to 173P. Thus, a plurality of gap regions GAP may be formed.

The plurality of lower mold layers 151 to 162 and the plurality of preliminary pads 151P to 162P, 168P, and 171P to 173P may partially remain to form a plurality of lower mold patterns 151R to 162R. Lower mold pad patterns (including 157PR of FIG. 34) in the pad regions HR described above may be formed from at least a portion of the plurality of lower mold layers 151 to 162 and the plurality of preliminary pads 151P to 162P, 168P, and 171P to 173P. For example, the lower mold pad patterns may be thicker than the lower mold patterns 151R to 162R.

Figure 35:
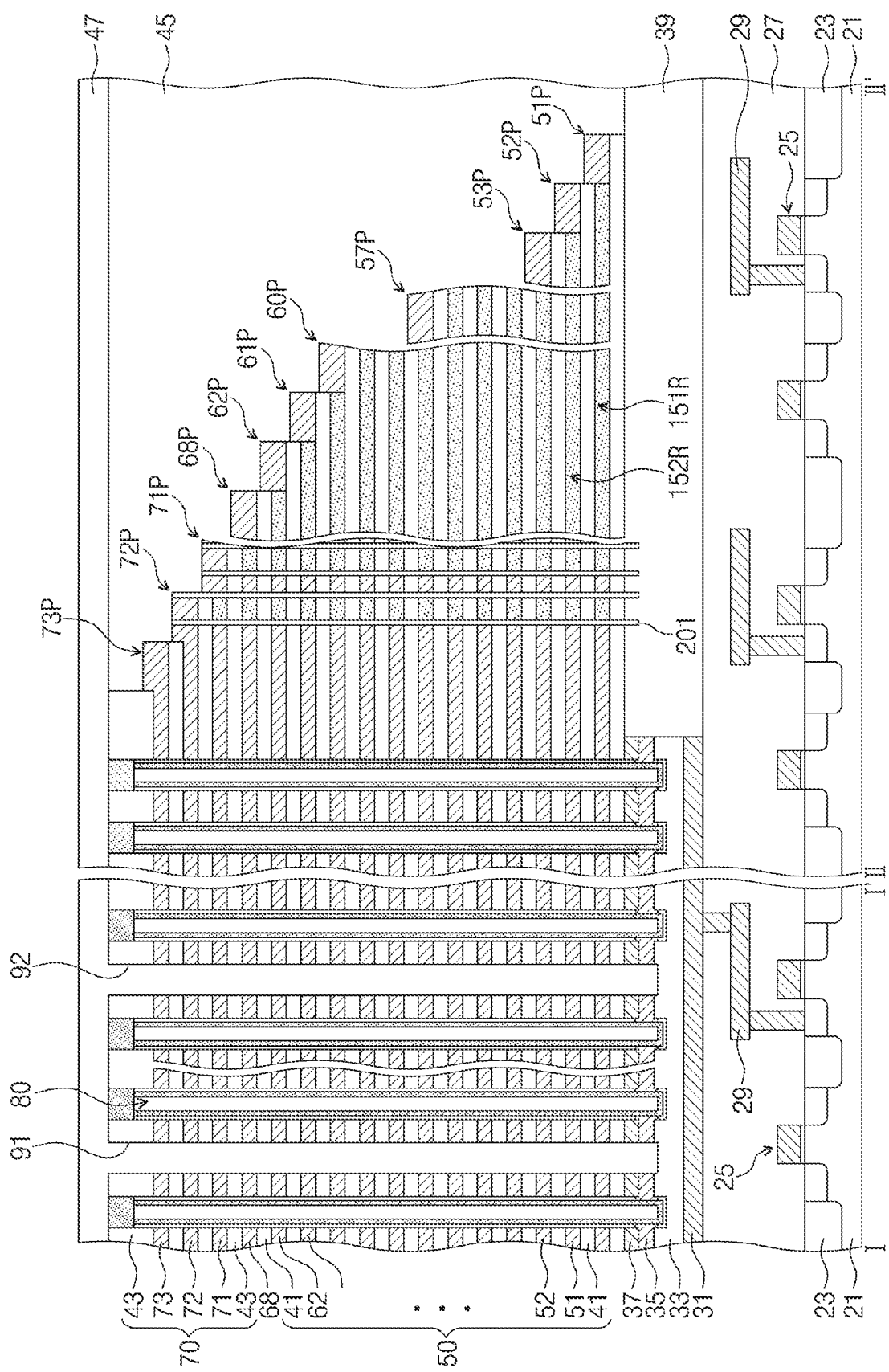
Figure 36:
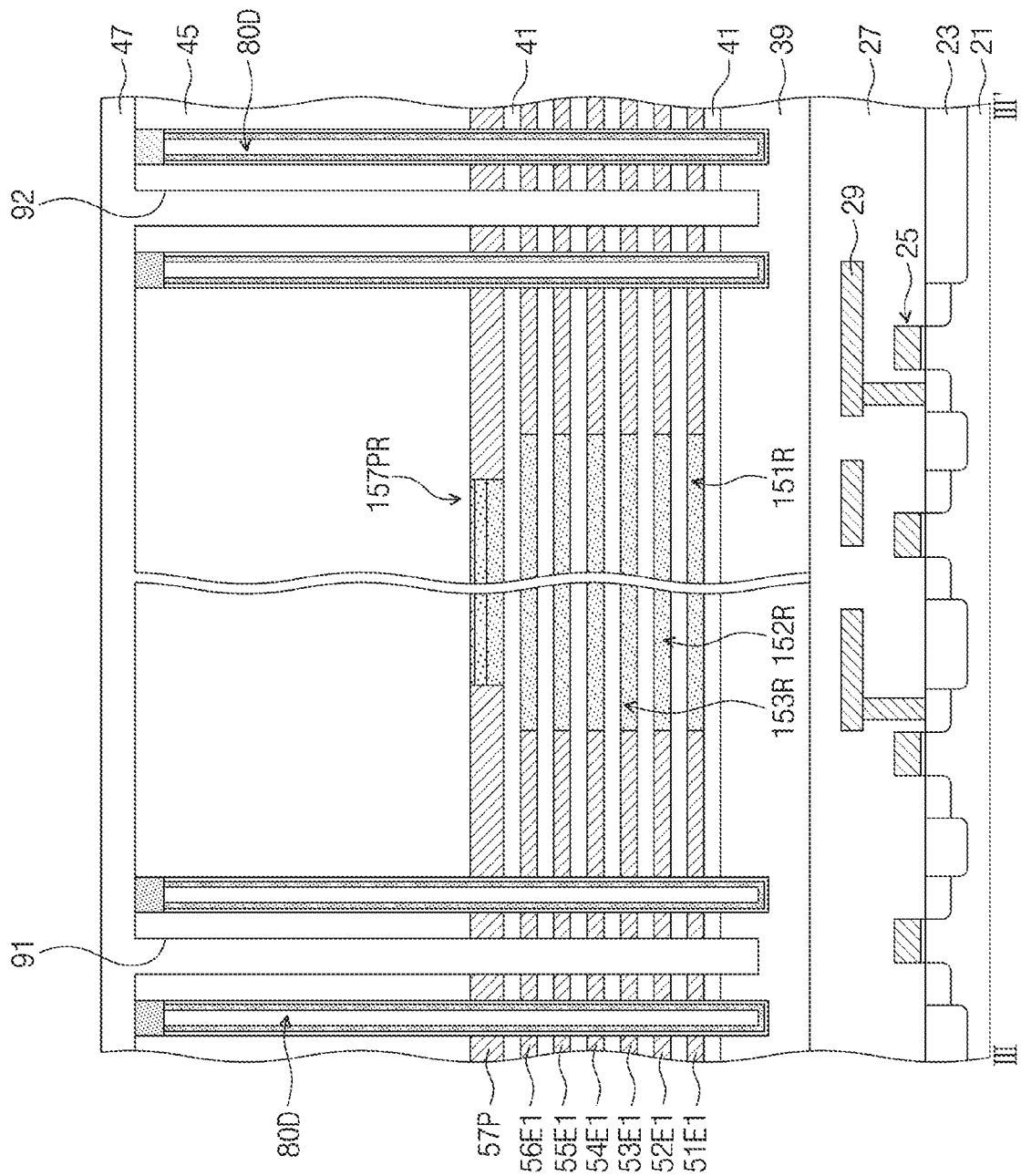

Referring to FIGS. 3, 35 and 36, a plurality of lower electrode layers 51 to 62, a dummy electrode layer 68 and a plurality of upper electrode layers 71 to 73 may be formed in the plurality of gap regions GAP. The plurality of lower electrode layers 51 to 62, the dummy electrode layer 68 and the plurality of upper electrode layers 71 to 73 may be formed of a metal and/or a conductive semiconductor material. The plurality of lower insulating layers 41 and the plurality of lower electrode layers 51 to 62, which are alternately and repeatedly stacked, may constitute a lower stack structure 50. The dummy electrode layer 68 may be formed on the lower stack structure 50. The plurality of upper insulating layers 43 and the plurality of upper electrode layers 71 to 73, which are alternately and repeatedly stacked, may constitute an upper stack structure 70. The upper stack structure 70 may be formed on the dummy electrode layer 68. A first insulating layer 47 may be formed to fill the first to fifth isolation trenches 91 to 95 and to cover the upper stack structure 70 and the upper interlayer insulating layer 45.

The plurality of upper electrode layers 71 to 73 may include a plurality of upper pads 71P to 73P. The plurality of lower electrode layers 51 to 62 may include a plurality of lower pads 51P to 62P. The plurality of lower pads 51P to 62P may include at least lower pads 51P, 52P, 53P, 60P, 61P and 62P. The dummy electrode layer 68 may include a dummy pad 68P.

Figure 37:
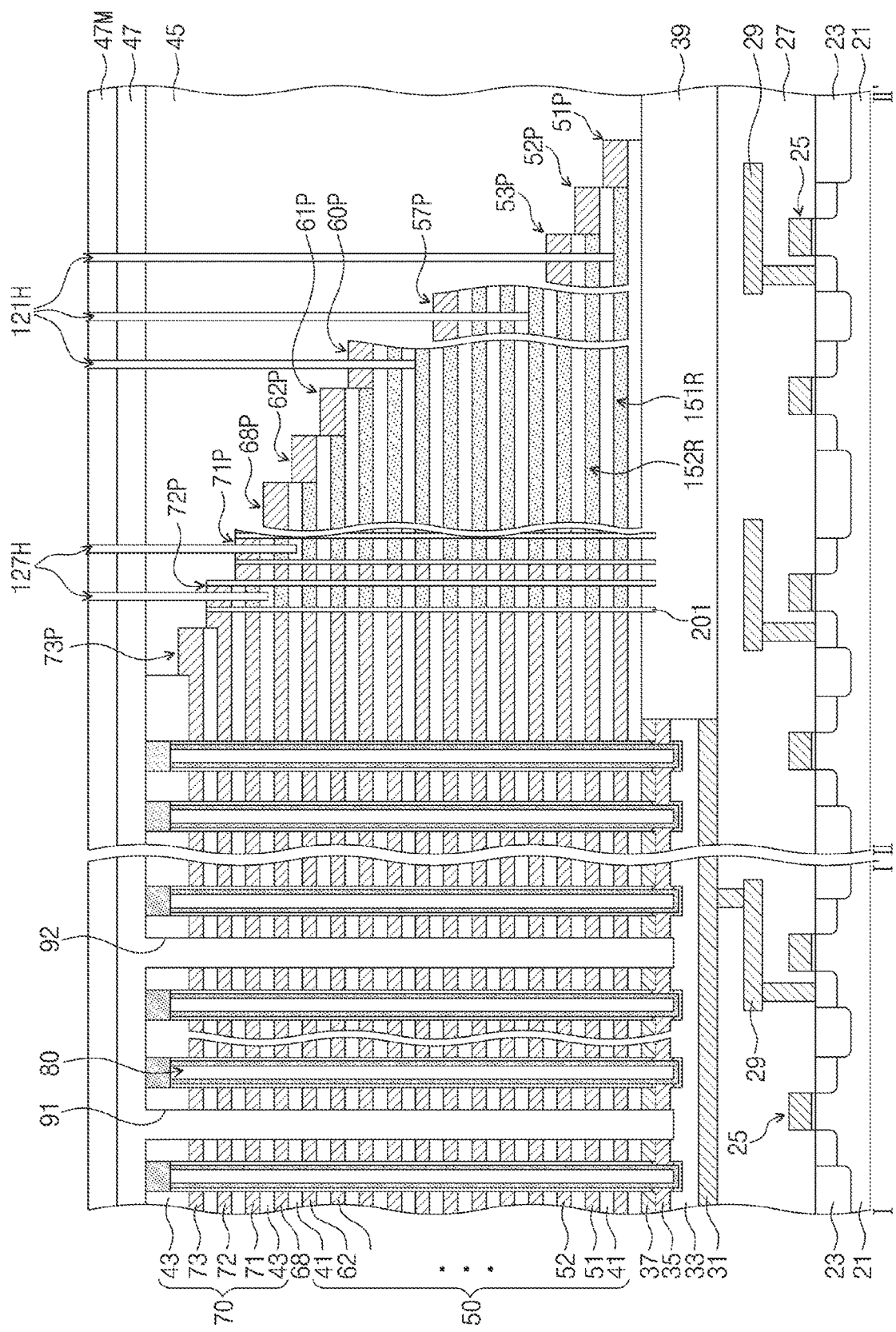
Figure 38:
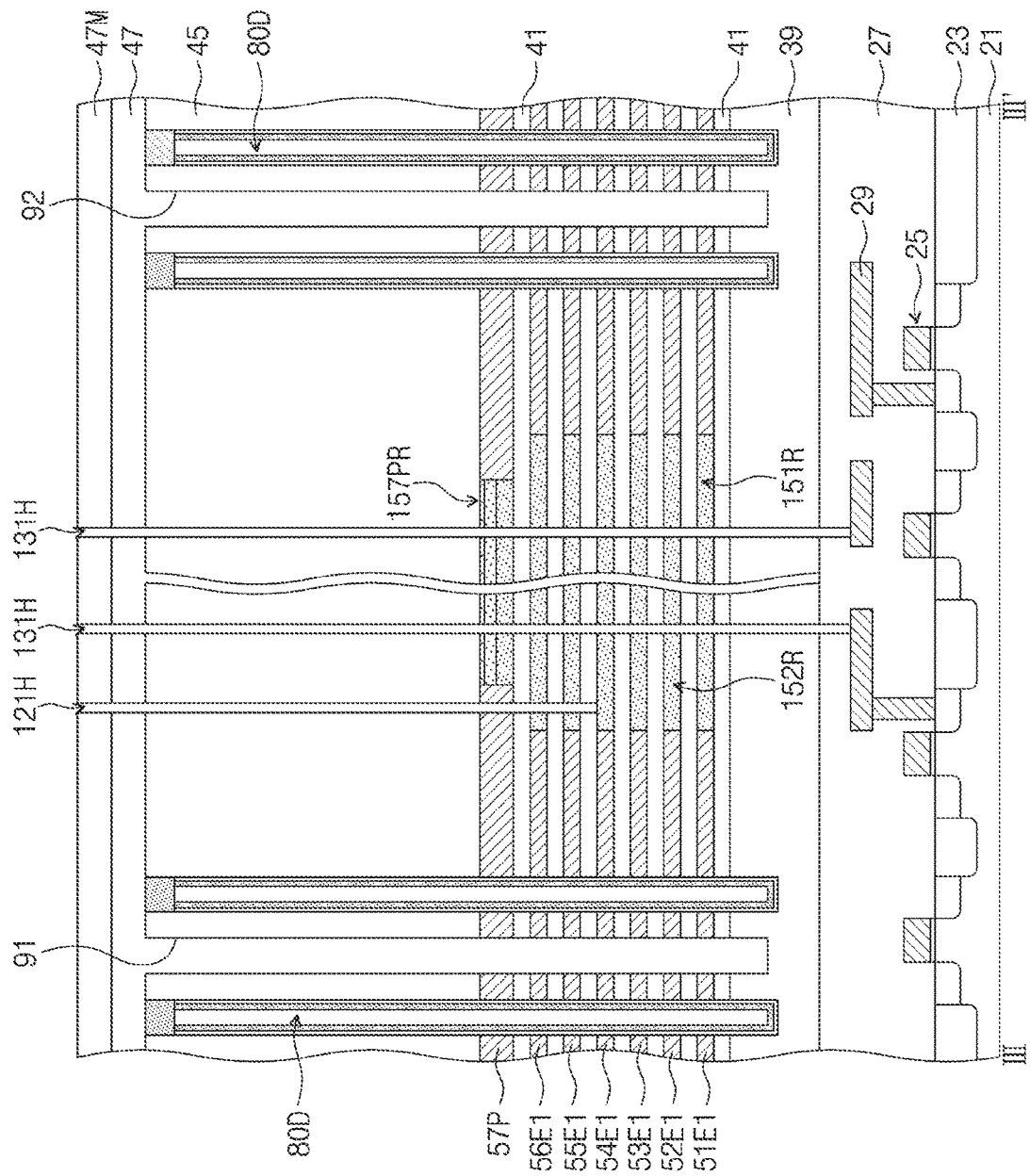

Referring to FIGS. 3, 37 and 38, a mask pattern 47M may be formed on the first insulating layer 47. A plurality of cell contact holes 121H, a plurality of selection contact holes 127H and a plurality of through-holes 131H may be formed using the mask pattern 47M as an etch mask. Each of the plurality of cell contact holes 121H may penetrate a corresponding one of the plurality of lower pads 51P to 62P. Each of the plurality of selection contact holes 127H may penetrate a corresponding one of the plurality of upper pads 71P to 73P. Each of the plurality of through-holes 131H may penetrate the plurality of lower mold patterns 151R to 162R and the middle interlayer insulating layer 39 to expose a corresponding one of the plurality of peripheral circuit interconnection lines 29. At least some of the plurality of cell contact holes 121H, the plurality of selection contact holes 127H and the plurality of through-holes 131H may be formed at the same time.

Figure 39:
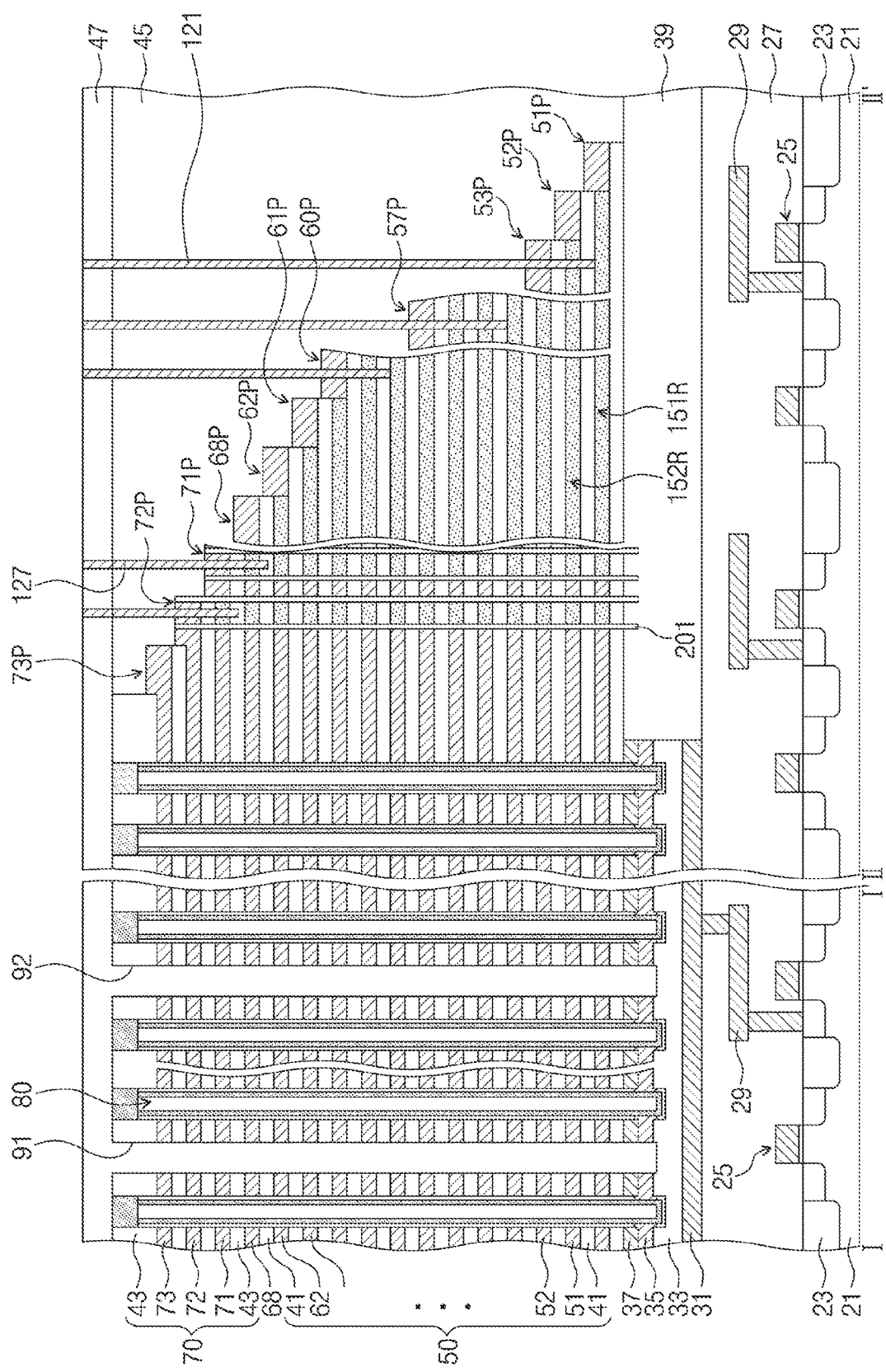
Figure 40:
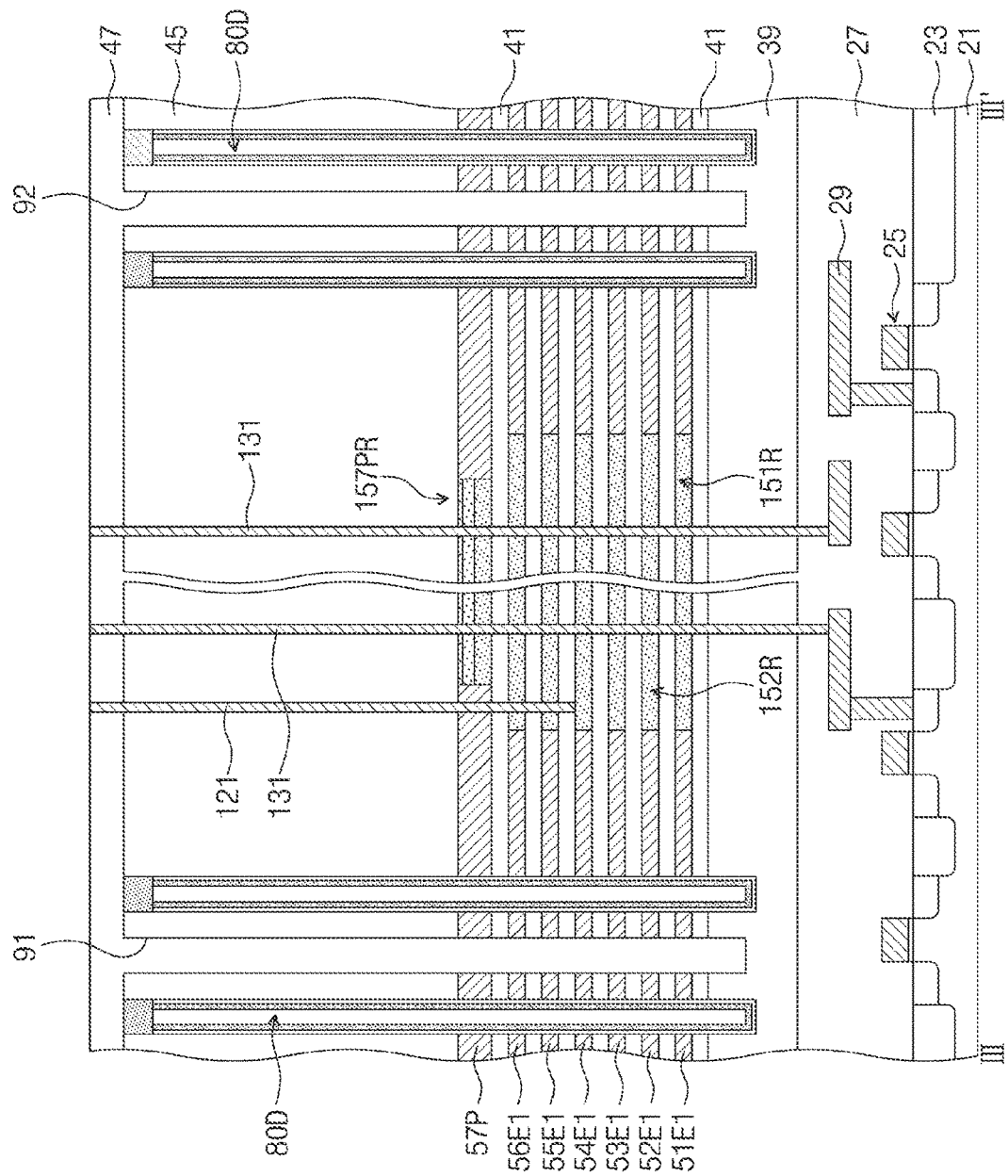

Referring to FIGS. 3, 39 and 40, a plurality of cell contact plugs 121 may be formed in the plurality of cell contact holes 121H, and a plurality of through-electrodes 131 may be formed in the plurality of through-holes 131H. A plurality of selection contact plugs 127 may be formed in the plurality of selection contact holes 127H. Thereafter, the mask pattern 47M may be removed.

Referring again to FIGS. 3 and 4 to 6, a second insulating layer 49 may be formed on the first insulating layer 47. A plurality of bit plugs 128 may be formed to penetrate the second insulating layer 49 and the first insulating layer 47. The plurality of bit plugs 128 may be connected to the plurality of channel structures 80. Each of the plurality of bit plugs 128 may be in contact with the bit pad 88. A plurality of upper plugs 129 may be formed to penetrate the second insulating layer 49. The plurality of upper plugs 129 may be connected to the plurality of cell contact plugs 121, the plurality of selection contact plugs 127, and the plurality of through-electrodes 131. Thereafter, a plurality of upper circuit interconnection lines 141 may be formed.

Each of the first and second insulating layers 47 and 49 may include an insulating material such as, for example, silicon oxide. Each of the plurality of cell contact plugs 121, the plurality of through-electrodes 131, the plurality of selection contact plugs 127, the plurality of bit plugs 128, the plurality of upper plugs 129 and the plurality of upper circuit interconnection lines 141 may include, for example, a metal and/or a metal nitride.

According to exemplary embodiments of the inventive concept, a 3D semiconductor memory device with high integration density and excellent electrical characteristics may be provided.

While the present inventive concept has been particularly shown and described with reference to the exemplary embodiments thereof, it will be apparent to those skilled in the art that various changes in form and detail may be made therein without departing from the spirit and scope of the present inventive concept as defined by the following claims.

What is claimed is:

1. A three-dimensional (3D) semiconductor memory device, comprising:
    a stack structure disposed on a substrate and comprising a lower stack structure and an upper stack structure;
    first and second isolation trenches defining the stack structure and extending in a first direction, wherein the first and second isolation trenches are spaced apart from each other in a second direction;
    a middle isolation trench penetrating the upper stack structure between the first and second isolation trenches and extending in the first direction; and
    a horizontal isolation pattern connected to the middle isolation trench and dividing the upper stack structure in the second direction,
    wherein the horizontal isolation pattern comprises a plurality of horizontal isolation portions, and each horizontal isolation portion extends in the first direction and is offset from an extension line of the middle isolation trench in the second direction or an opposite direction to the second direction,
    wherein the horizontal isolation portions are arranged in a zigzag pattern with the extension line of the middle isolation trench interposed therebetween.

2. The 3D semiconductor memory device of claim 1, wherein the upper stack structure comprises:
    a plurality of first upper electrode layers; and
    a plurality of second upper electrode layers disposed on the first upper electrode layers,
    wherein the first upper electrode layers are disposed at the same level, and are separated from each other by the middle isolation trench and the horizontal isolation pattern.

3. The 3D semiconductor memory device of claim 2, wherein the first upper electrode layers comprise a plurality of first pad protrusions, and each first pad protrusion protrudes in the second direction or the opposite direction to the second direction toward one of the horizontal isolation portions.

4. The 3D semiconductor memory device of claim 3, wherein the first upper electrode layers comprise:
    a first first upper electrode layer disposed between the first isolation trench and the middle isolation trench; and a second first upper electrode layer disposed between the middle isolation trench and the second isolation trench, wherein the first first upper electrode layer comprises a first first pad protrusion, and the second first upper electrode layer comprises a second first pad protrusion, wherein the first first pad protrusion protrudes from the extension line of the middle isolation trench toward the second isolation trench, wherein the second first pad protrusion protrudes from the extension line of the middle isolation trench toward the first isolation trench.

5. The 3D semiconductor memory device of claim 3, wherein the second upper electrode layers expose the first pad protrusions of the first upper electrode layers.

6. The 3D semiconductor memory device of claim 5, wherein the second upper electrode layers comprise a plurality of second pad protrusions, and each second pad protrusion protrudes in the second direction or the opposite direction to the second direction toward one of the horizontal isolation portions.

7. The 3D semiconductor memory device of claim 2, further comprising:
a plurality of first contact plugs penetrating the first upper electrode layers;
a plurality of second contact plugs penetrating the second upper electrode layers; and
a first mold pattern disposed at the same level as the first upper electrode layers,
wherein the second contact plugs penetrate the first mold pattern.

8. The 3D semiconductor memory device of claim 7, wherein the first mold pattern is one of a plurality of first mold patterns, and
the plurality of first mold patterns is disposed between the extension line of the middle isolation trench and the horizontal isolation portions.

9. The 3D semiconductor memory device of claim 2, further comprising:
a plurality of first contact plugs penetrating the first upper electrode layers;
a plurality of second contact plugs penetrating the second upper electrode layers;
a first mold pattern disposed at the same level as the first upper electrode layers; and
a plurality of lower mold patterns disposed at the same levels as lower electrode layers constituting the lower stack structure, respectively,
wherein each of the first contact plugs and the second contact plugs penetrates at least one of the first mold pattern or the lower mold patterns.

10. The 3D semiconductor memory device of claim 1, wherein the horizontal isolation pattern further comprises:
a plurality of vertical isolation portions extending from the horizontal isolation portions in the second direction or the opposite direction to the second direction.

11. The 3D semiconductor memory device of claim 1, further comprising:
a selection line isolation pattern filling the middle isolation trench,
wherein a bottom surface of the selection line isolation pattern is higher than a topmost surface of the lower stack structure.

12. The 3D semiconductor memory device of claim 1, wherein the horizontal isolation pattern penetrates the lower stack structure.

13. The 3D semiconductor memory device of claim 1, further comprising:
a cell array region defined by the first isolation trench and the middle isolation trench;
a first connection region and a second connection region spaced apart from each other with the cell array region interposed therebetween; and
a plurality of channel structures and a plurality of support structures penetrating the lower stack structure and the upper stack structure,
wherein the plurality of channel structures is disposed in the cell array region,
wherein the plurality of support structures is disposed along the first direction in at least one of the first connection region and the second connection region, and
wherein the plurality of support structures comprises the same layers as the plurality of channel structures.

14. The 3D semiconductor memory device of claim 13, wherein the plurality of support structures includes:
a plurality of first support structures adjacent to the first isolation trench; and
a plurality of second support structures adjacent to the middle isolation trench.

15. A 3D semiconductor memory device, comprising:
a stack structure disposed on a substrate and comprising a lower stack structure and an upper stack structure;
first and second isolation trenches defining the stack structure and extending in a first direction, wherein the first and second isolation trenches are spaced apart from each other in a second direction;
a middle isolation trench penetrating the upper stack structure between the first and second isolation trenches and extending in the first direction; and
a horizontal isolation pattern connected to the middle isolation trench and dividing the upper stack structure in the second direction,
wherein the horizontal isolation pattern comprises a plurality of horizontal isolation portions, and each horizontal isolation portion extends in the first direction and is offset from an extension line of the middle isolation trench in the second direction or an opposite direction to the second direction,
wherein a bottom surface of the horizontal isolation pattern is higher than a topmost surface of the lower stack structure.

16. A three-dimensional (3D) semiconductor memory device, comprising:
a stack structure disposed on a substrate and comprising a lower stack structure and an upper stack structure;
first and second isolation trenches defining the stack structure and extending in a first direction, wherein the first and second isolation trenches are spaced apart from each other in a second direction;
a middle isolation trench penetrating the upper stack structure between the first and second isolation trenches and extending in the first direction; and
a horizontal isolation pattern connected to the middle isolation trench and dividing the upper stack structure in the second direction,
wherein the upper stack structure comprises:
a pair of first upper electrode layers disposed at the same level,
wherein the first upper electrode layers respectively comprise pad protrusions protruding toward each other; and
a pair of second upper electrode layers disposed at the same level on the first upper electrode layers, wherein pad protrusions of the second upper electrode layers are spaced apart from the pad protrusions of the first upper electrode layers in the first direction when viewed in a plan view.

17. The 3D semiconductor memory device of claim 16, wherein the 3D semiconductor memory device further comprises:
  a cell array region; and
  a first connection region and a second connection region spaced apart from each other with the cell array region interposed therebetween,
  wherein the pair of first upper electrode layers comprises a first first upper electrode layer and a second first upper electrode layer,
  wherein the pad protrusion of the first first upper electrode layer and the pad protrusion of the second first upper electrode layer are disposed in the first connection region.

18. The 3D semiconductor memory device of claim 17, wherein the pad protrusions of the pair of first upper electrode layers are spaced apart from each other in the first direction.

* * * * *